(12) United States Patent
Liu et al.

(10) Patent No.: US 11,855,369 B2
(45) Date of Patent: Dec. 26, 2023

(54) CONNECTOR ASSEMBLY

(71) Applicant: LOTES CO., LTD, Keelung (TW)

(72) Inventors: Jun Liu, Keelung (TW); Chien Chih Ho, Keelung (TW); Wen Chang Chang, Keelung (TW)

(73) Assignee: LOTES CO., LTD, Keelung (TW)

( * ) Notice: Subject to any disclaimer, the term of this patent is extended or adjusted under 35 U.S.C. 154(b) by 288 days.

(21) Appl. No.: 17/526,050

(22) Filed: Nov. 15, 2021

(65) Prior Publication Data
US 2022/0209442 A1 Jun. 30, 2022

(30) Foreign Application Priority Data

Dec. 29, 2020 (CN) .......................... 202023249678.3

(51) Int. Cl.
| | |
|---|---|
| H01R 12/00 | (2006.01) |
| H01R 12/70 | (2011.01) |
| H01R 12/52 | (2011.01) |
| H01R 12/58 | (2011.01) |
| H01R 13/05 | (2006.01) |

(52) U.S. Cl.
CPC ......... *H01R 12/7076* (2013.01); *H01R 12/52* (2013.01); *H01R 12/585* (2013.01); *H01R 13/057* (2013.01)

(58) Field of Classification Search
CPC .. H01R 12/7076; H01R 12/52; H01R 12/585; H01R 13/057
USPC .......................................................... 439/68
See application file for complete search history.

(56) References Cited

U.S. PATENT DOCUMENTS

| | | | | |
|---|---|---|---|---|
| 4,356,532 A | * | 10/1982 | Donaher ................ | H05K 1/141 439/70 |
| 7,445,463 B2 | * | 11/2008 | Tang .................. | H01R 12/7076 439/71 |
| 8,167,644 B2 | * | 5/2012 | Mason .................. | H01R 12/57 439/516 |
| 8,172,615 B2 | * | 5/2012 | Mason ............... | H01R 13/6588 439/108 |

(Continued)

FOREIGN PATENT DOCUMENTS

CN 109786996 A 5/2019

*Primary Examiner* — Abdullah A Riyami
*Assistant Examiner* — Vladimir Imas
(74) *Attorney, Agent, or Firm* — Locke Lord LLP; Tim Tingkang Xia, Esq.

(57) ABSTRACT

A connector assembly includes multiple terminals. Each terminal includes a conductive portion. The terminals include first and second high speed signal terminals and a low speed signal terminal. The conductive portions of the first and second high speed signal terminals and the low speed signal terminal are correspondingly defined as first, second and third conductive portions. An adapter board is located above a circuit board to be conductively connected to a cable directly or indirectly. The adapter board includes first and second signal circuit layers located at different heights. The first signal circuit layer includes a first high speed signal circuit conductively connecting the first conductive portion and a conductive wire of the cable. The second signal circuit layer includes a second high speed signal circuit conductively connecting the second conductive portion and another conductive wire of the cable. The third conductive portion is conductively connected to the circuit board.

20 Claims, 18 Drawing Sheets

(56) References Cited

U.S. PATENT DOCUMENTS

| | | | | |
|---|---|---|---|---|
| 8,277,255 B2* | 10/2012 | Consoli | H01R 13/66 |
| | | | 439/620.2 |
| 8,575,529 B2* | 11/2013 | Asahi | G02B 6/4232 |
| | | | 341/143 |
| 8,727,808 B2* | 5/2014 | Mason | H01R 13/6585 |
| | | | 439/607.05 |
| 8,727,815 B1* | 5/2014 | Mongold | H01R 43/22 |
| | | | 439/943 |
| 8,821,188 B2* | 9/2014 | Chang | H01R 13/648 |
| | | | 439/607.01 |
| 8,827,730 B2* | 9/2014 | Ihara | H01R 12/714 |
| | | | 439/206 |
| 8,932,080 B2* | 1/2015 | Chang | H01R 12/52 |
| | | | 439/607.1 |
| 9,099,819 B2* | 8/2015 | Hwang | H01R 13/648 |
| 9,106,022 B2* | 8/2015 | Cai | H01R 13/6471 |
| 9,252,521 B1* | 2/2016 | Beaman | H01R 12/718 |
| 9,692,147 B1* | 6/2017 | Nekkanty | H01R 12/73 |
| 9,837,737 B1* | 12/2017 | Huang | H01R 12/716 |
| 9,912,084 B2* | 3/2018 | Costello | H01R 12/7076 |
| 10,079,443 B2* | 9/2018 | Costello | H01R 13/2442 |
| 10,348,015 B2* | 7/2019 | Mason | H01R 13/2442 |
| 10,381,756 B2* | 8/2019 | Ju | H01R 13/2442 |
| 10,741,951 B2* | 8/2020 | Mason | H01R 12/61 |
| 10,811,800 B1* | 10/2020 | Blackburn | H01R 12/75 |
| 10,879,638 B2* | 12/2020 | Mason | H01R 43/0256 |
| 10,985,109 B2* | 4/2021 | Kim | H01L 21/563 |
| 11,121,494 B2* | 9/2021 | Kurita | H01R 4/028 |
| 11,309,646 B2* | 4/2022 | Ou | H01R 12/7082 |
| 11,443,998 B2* | 9/2022 | Blackburn | H01L 23/367 |
| 2011/0043239 A1* | 2/2011 | Tomita | H01R 13/2414 |
| | | | 324/756.03 |
| 2015/0079815 A1* | 3/2015 | Leigh | H01R 12/712 |
| | | | 439/74 |
| 2019/0148859 A1* | 5/2019 | Mason | H01R 12/79 |
| | | | 439/68 |
| 2021/0074333 A1* | 3/2021 | Zhao | G11C 8/18 |

* cited by examiner

CONNECTOR ASSEMBLY

CROSS-REFERENCE TO RELATED PATENT APPLICATION

This non-provisional application claims priority to and the benefit of, pursuant to 35 U.S.C. § 119(a), patent application Serial No. CN202023249678.3 filed in China on Dec. 29, 2020. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to a connector assembly, and particularly to a connector assembly in which an adapter board is provided between a chip module and a circuit board.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing connector assembly is used to electrically connect a chip module to a circuit board. The circuit board includes a high speed circuit layer. The high speed circuit layer includes a plurality of first high speed signal circuits, a plurality of second high speed signal circuits and a plurality of low speed signal circuits. The connector assembly includes an electrical connector and a high speed connector mounted on the circuit board and electrically connected to the circuit board. The high speed connector is mated with a cable end connector. The electrical connector includes an insulating body and a plurality of terminals accommodated in the insulating body. Each terminal is provided with a contact portion and a conductive portion. The contact portion is used to upward abut the chip module. The terminals include a plurality of first high speed signal terminals, a plurality of second high speed signal terminals and a plurality of low speed signal terminals. The conductive portion of each first high speed signal terminal is defined as a first conductive portion. The conductive portion of each second high speed signal terminal is defined as a second conductive portion. The conductive portion of each low speed signal terminal is defined as a third conductive portion. Each first high speed signal circuit is conductively connected to the first conductive portion and the high speed connector, each second high speed signal circuit is conductively connected to the second conductive portion and the high speed connector, and the third conductive portion is conductively connected to a low speed signal circuit, thereby facilitating high speed signal transmission.

However, the high speed circuit layer on the circuit board is electrically connected to the chip module by the first high speed signal terminals, the second high speed signal terminals and the low speed signal terminals, and the high speed connector is mounted and electrically connected to the circuit board, which results in the circuits on the circuit board to be arranged densely, affecting the high speed transmission effect. Further, the first high speed signal circuits and the second high speed signal circuits are located in the same high speed circuit layer, which easily results in crosstalk interferences between signal transmissions thereof, thus not satisfying the usage requirements of the connector assembly to the high frequency characteristics.

Therefore, a heretofore unaddressed need to design a novel connector assembly exists in the art to address the aforementioned deficiencies and inadequacies.

SUMMARY

In view of the deficiency of the background, the present invention is directed to a connector assembly, in which an adapter board is provided with signal circuit layers at different heights electrically connecting a cable and high speed signal terminals, and a low speed signal terminal conductively connects a mating component and a circuit board at an upper side and a lower side of the adapter board, thus satisfying high frequency characteristics thereof.

To achieve the foregoing objective, the present invention adopts the following technical solutions.

A connector assembly is configured to electrically connect a mating component to a circuit board. The connector assembly includes: a plurality of conductive terminals, wherein each of the conductive terminals is provided with a contact portion and a conductive portion, the conductive terminals comprise a plurality of high speed signal terminals and at least one low speed signal terminal, the high speed signal terminals comprise at least one first high speed signal terminal and at least one second high speed signal terminal, the conductive portion of the first high speed signal terminal is defined as a first conductive portion, the conductive portion of the second high speed signal terminal is defined as a second conductive portion, and the conductive portion of the low speed signal terminal is defined as a third conductive portion; and an adapter board, located above the circuit board and configured to be conductively connected to a cable directly or indirectly, wherein the contact portion is located above the adapter board and configured to be electrically connected to the mating component, the adapter board comprises a plurality of signal circuit layers located at different heights in a vertical direction, the signal circuit layers comprise a first signal circuit layer and a second signal circuit layer located below the first signal circuit layer, the first signal circuit layer comprises at least one first high speed signal circuit electrically connecting the first conductive portion and a conductive wire of the cable, the second signal circuit layer comprises at least one second high speed signal circuit electrically connecting the second conductive portion and another conductive wire of the cable, and the third conductive portion is electrically connected to the circuit board.

In certain embodiments, the conductive terminals further comprise at least one ground terminal, the conductive portion of the ground terminal is defined as a fourth conductive portion, the adapter board further comprises at least one grounding layer, one of the at least one grounding layer is located between the first signal circuit layer and the second circuit layer, and the fourth conductive portion is electrically connected to the grounding layer.

In certain embodiments, the third conductive portion and the fourth conductive portion are both exposed on a lower surface of the adapter board and are respectively soldered to the circuit board.

In certain embodiments, the high speed signal terminals comprises a plurality of pairs of first high speed signal terminals and a plurality of pairs of second high speed signal terminals, each pair of the first high speed signal terminals and each pair of the second high speed signal terminals are configured to transmit differential signals, the first signal circuit layer comprises a plurality of pairs of first high speed signal circuits, and the second signal circuit layer comprises a plurality of pairs of second high speed signal circuits.

In certain embodiments, the conductive portion is located at a lower end of each of the conductive terminals, the first conductive portion downward ends at one end of the corresponding first high speed signal circuit, and the second conductive portion downward ends at one end of the corresponding second high speed signal circuit.

In certain embodiments, the adapter board is provided with a plurality of accommodating slots formed by being downward concavely provided on an upper surface thereof, the accommodating slots correspondingly accommodate the conductive terminals, each of the conductive terminals is provided with a base portion accommodated in a corresponding one of the accommodating slots, the conductive portion is formed by extending downward from the base portion, the first conductive portion is located above the second conductive portion, each of the conductive terminals further comprises a strip connecting portion provided on at least one side of the base portion, and the strip connecting portion extends horizontally outward to an upper location of the upper surface of the adapter board outside the corresponding one of the accommodating slots.

In certain embodiments, an upper surface of the adapter board is provided with at least one first high speed conductive sheet and at least one second high speed conductive sheet, the first conductive portion is electrically connected to the first high speed conductive sheet by surface mounting, the second conductive portion is electrically connected to the second high speed conductive sheet by surface mounting, the adapter board further comprises at least one first high speed connecting circuit and at least one second high speed connecting circuit, each of the at least one first high speed connecting circuit extends in the vertical direction and connects one of the at least one first high speed conductive sheet and one of the at least one first high speed signal circuit, and each of the at least one second high speed connecting circuit extends in the vertical direction and connects one of the at least one second high speed conductive sheet and one of the at least one second high speed signal circuit.

In certain embodiments, the connector assembly further includes an insulating body located above the adapter board, wherein each of the conductive terminals comprises a base portion, a contact arm formed by extending from one end of the base portion and the conductive portion formed by extending from another end of the base portion, the base portion is at least partially embedded in the insulating body, the contact arm is provided with the contact portion, and the conductive terminals are fixed to the insulating body by insert-molding.

In certain embodiments, the conductive portion and the corresponding base portion are located on a same horizontal plane, and the base portion is limited between an upper surface and a lower surface of the insulating body.

In certain embodiments, a portion of the conductive portion of each of the conductive terminals exposed in the insulating body is provided with at least one through hole running vertically therethrough, a solder enters the through hole and covers an upper surface of the conductive portion, and the conductive portion is fixed to the adapter board by the solder.

In certain embodiments, the connector assembly further includes a metal sheet embedded in the insulating body, wherein the conductive terminals further comprise a plurality of ground terminals connected to the metal sheet, and the metal sheet is provided to be spaced apart from the first high speed signal terminal, the second high speed signal terminal and the low speed signal terminal.

In certain embodiments, the metal sheet is a metal plate which is only connected to the ground terminals after forming the conductive terminals.

In certain embodiments, the insulating body is provided with a plurality of accommodating holes, each of the accommodating holes exposes the contact arm of a corresponding one of the conductive terminals, the metal sheet is provided with a plurality of strip connecting bridges connecting the ground terminals, and each of the strip connecting bridges is provided on a connecting location of the base portion and the contact arm and is exposed in a corresponding one of the accommodating holes.

In certain embodiments, the adapter board further comprises at least one low speed signal circuit and at least one grounding circuit, the low speed signal circuit and the grounding circuit respectively extend along the vertical direction in the adapter board, an upper surface of the adapter board is provided with a low speed signal conductive sheet corresponding to a top end of each of the at least one low speed signal circuit, the upper surface of the adapter board is further provided with a grounding conductive sheet corresponding to a top end of each of the at least one grounding circuit, the conductive terminals comprise at least one ground terminal, the conductive portion of the ground terminal is defined as a fourth conductive portion, the low speed signal conductive sheet is electrically connected to the third conductive portion and the low speed signal circuit, and the grounding conductive sheet is electrically connected to the fourth conductive portion and the grounding circuit.

In certain embodiments, each of the accommodating holes comprises a first hole, a second hole and a third hole, the first hole runs vertically through the insulating body and is configured to accommodate the contact arm, the second hole is formed by being downward concavely provided on an upper surface of the insulating body, the third hole is formed by being upward concavely provided on a lower surface of the insulating body, the second hole is in communication with the first hole and is in downward communication with the third hole, the first hole and the third hole are provided to be horizontally spaced apart, the base portion and the conductive portion are both accommodated in the second hole, the conductive portion is downward exposed in the third hole, and the third hole is configured to accommodate a solder.

In certain embodiments, a lower surface of the adapter board comprises a plurality of pads having a quantity identical to a quantity of the conductive terminals, the pads comprise at least one first pad and a plurality of second pads, each of the at least one first pad is electrically connected to one of the at least one low speed signal terminal, each of the second pads is not electrically connected to the high speed signal terminals and the at least one low speed signal terminal, the circuit board is provided with a plurality of solder pads having a quantity identical to the quantity of the pads and one-to-one corresponding to the pads, and each of the pads and a corresponding one of the solder pads are soldered and fixed by a solder.

In certain embodiments, the adapter board comprises a plurality of conductive sheets, the conductive portion of each of the conductive terminals is electrically connected to one of the conductive sheets, one of the conductive terminals comprises a first terminal and a second terminal formed individually, the first terminal is provided with a first leg and a first contact arm formed by extending upward from the first leg, the contact portion is formed on the first contact arm, the second terminal comprises a second leg and a second contact arm formed by extending upward from the second leg, the second contact arm upward abuts the first contact arm, and the first leg and the second leg altogether form the conductive portion.

In certain embodiments, the first leg and the second leg are attached to each other, the first contact arm and the second contact arm are attached to each other, and the second contact arm extends along the first contact arm and ends before reaching the contact portion.

In certain embodiments, the first leg and the second leg are provided to be horizontally side-by-side, the second contact arm has a first arm located at one side of the first contact arm and a second arm bending and extending from the first arm and extending to be below the first contact arm, and the second arm upward abuts the first contact arm.

In certain embodiments, one of the conductive terminals comprises a first terminal and a second terminal formed individually, the first terminal is provided with a first leg and a first contact arm formed by extending upward from the first leg, the contact portion is formed on the first contact arm, the second terminal comprises a second leg and a second contact arm formed by extending upward from the second leg, the second contact arm upward abuts the first contact arm, the adapter board is provided with two conductive sheets respectively corresponding to and conductively connected to the first leg and the second leg, the conductive sheet being conductively connected to the first leg and the conductive sheet being conductively connected to the second leg are provided to be spaced apart on the adapter board and are electrically connected to each other.

Compared with the related art, certain embodiments of the present invention has the following beneficial effects.

Each first high speed signal terminal is provided with the first conductive portion, each second high speed signal terminal is provided with the second conductive portion, and each low speed signal terminal is provided with the third conductive portion. The adapter board includes a plurality of signal circuit layers located at different heights in the vertical direction. The signal circuit layers include a first signal circuit layer and a second signal circuit layer located below the first signal circuit layer. The first signal circuit layer of the adapter board includes at least one first high speed signal circuit electrically connecting the first conductive portion and a conductive wire of the cable. The second signal circuit layer of the adapter board includes at least one second high speed signal circuit electrically connecting the second conductive portion and another conductive wire of the cable. The third conductive portion is electrically connected to the circuit board. By distributing the high speed signal circuits in the signal circuit layers at different heights, it is conducive to reducing the crosstalk interferences between the signal circuit layers in the high speed signal transmission process. The high speed signal circuits and the low speed signal circuits are electrically connected to different components, that is, the high speed signal circuits may be adapted to the high speed connector without going through the circuit board, thus preventing from being adapted all through the circuits on the circuit board such that the circuits on the circuit board become arranged too densely and too long and affecting the signal transmission effect, and satisfying the usage requirements of the connector assembly to the high frequency characteristics.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
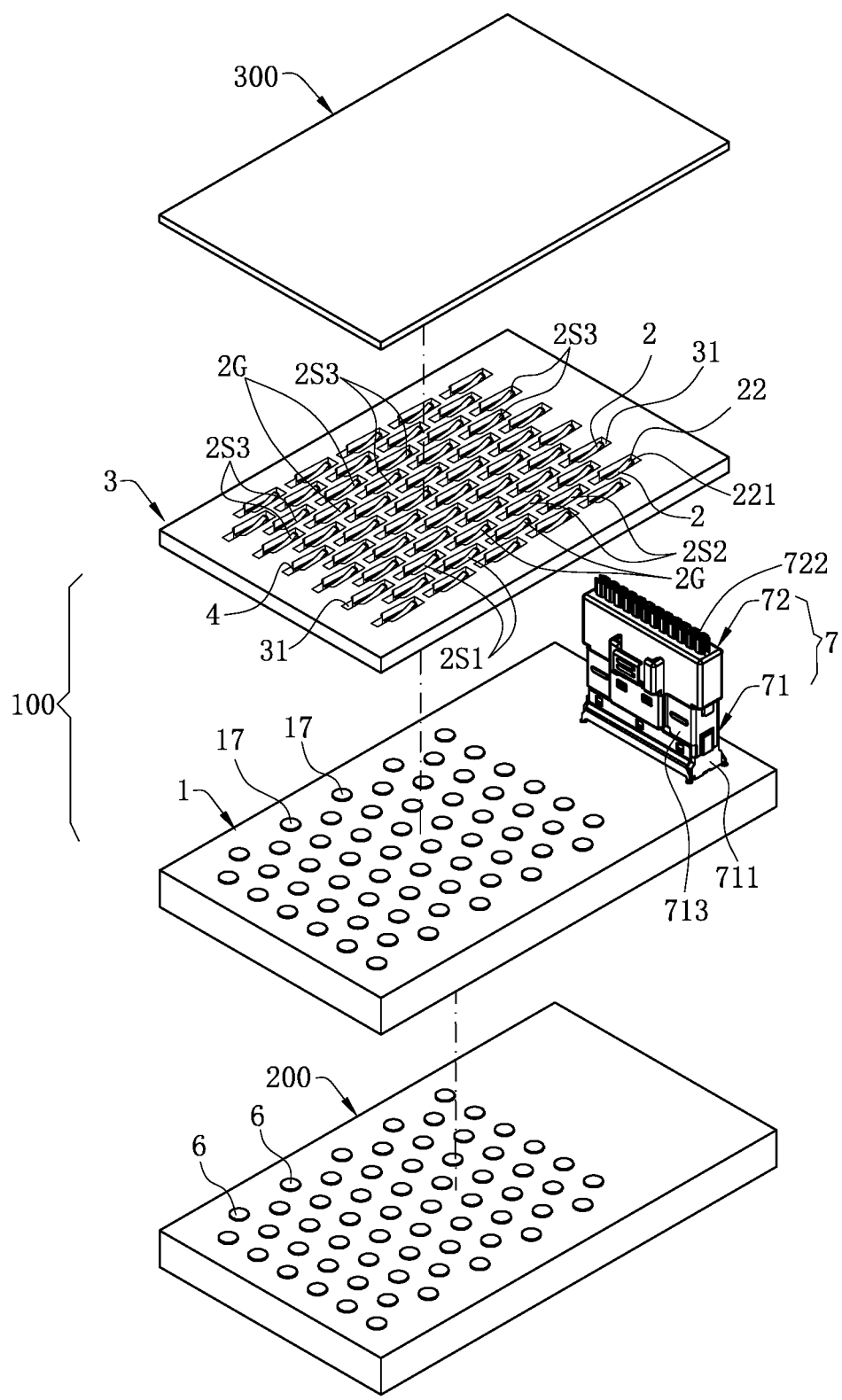
FIG. 1 is a perspective exploded view of a connector assembly, a mating component, a cable connector assembly and a circuit board according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-18. In accordance with the purposes of this invention, as embodied and broadly described herein, this invention, in one aspect, relates to a connector assembly.

As shown in FIG. 1 to FIG. 18, for convenience to understand the accompanying drawings, a forward direction in a front-rear direction is defined as a positive direction of the X-axis, a rightward direction in a left-right direction is defined as a positive direction of the Y-axis, and an upward direction in a vertical direction is defined as a positive direction of the Z-axis.

FIG. 1 to FIG. 10 show a connector assembly 100 according to a first embodiment of the present invention. The connector assembly 100 is used to electrically connect a mating component 300 to a circuit board 200. The connector assembly 100 includes an adapter board 1, a plurality of conductive terminals 2 soldered to the adapter board 1, an insulating body 3 fixed to the conductive terminals 2, and a metal sheet 4 embedded in the insulating body 3. In this embodiment, the mating component 300 is a chip module. In other embodiments, the mating component 300 may be other types of components, and it is not required to provide the insulating body 3, such that the conductive terminals 2 are fixed to the adapter board 1 by soldering.

Figure 2:
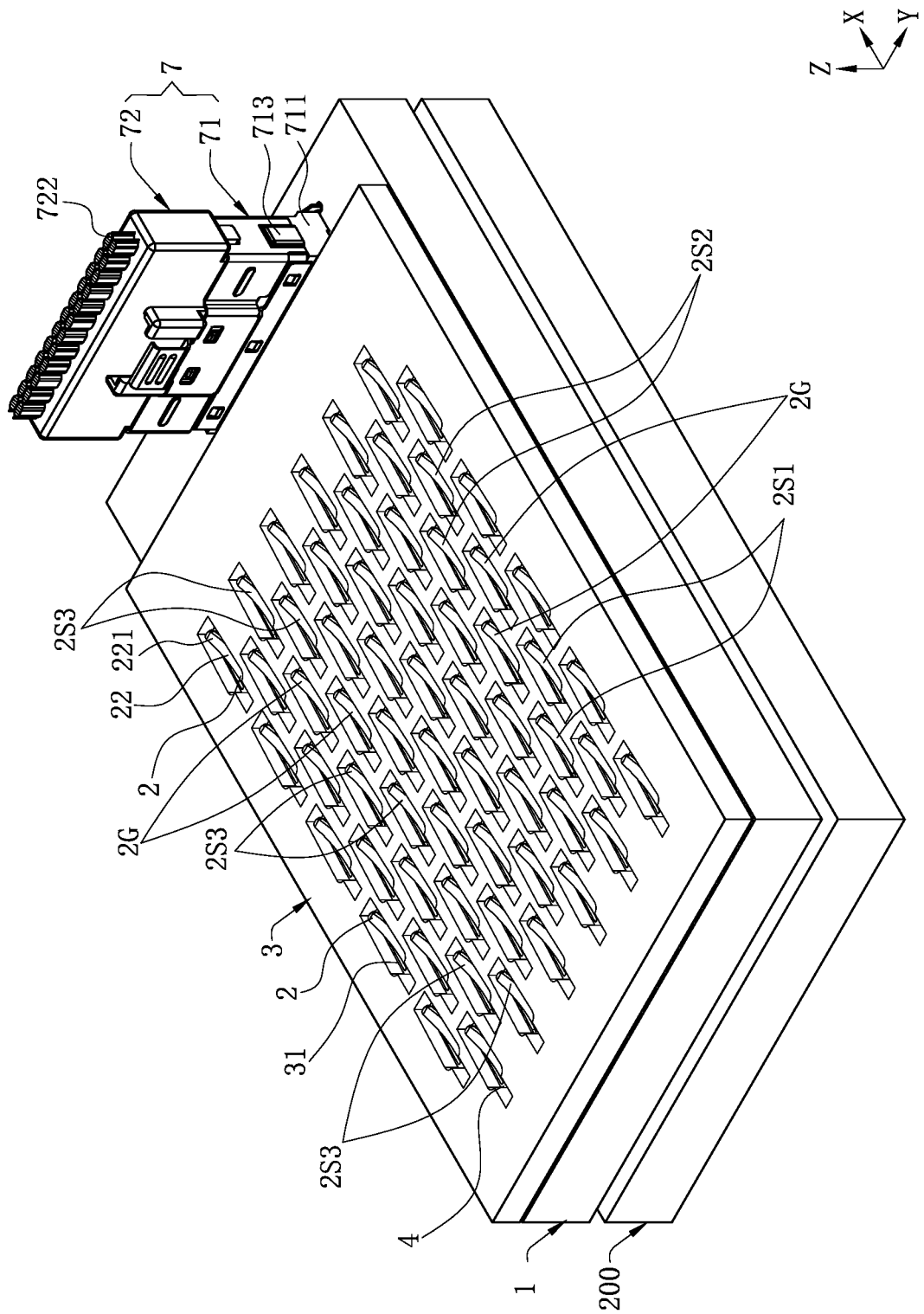
FIG. 2 is a perspective assembled view of the connector assembly and the circuit board in FIG. 1.
Figure 4:
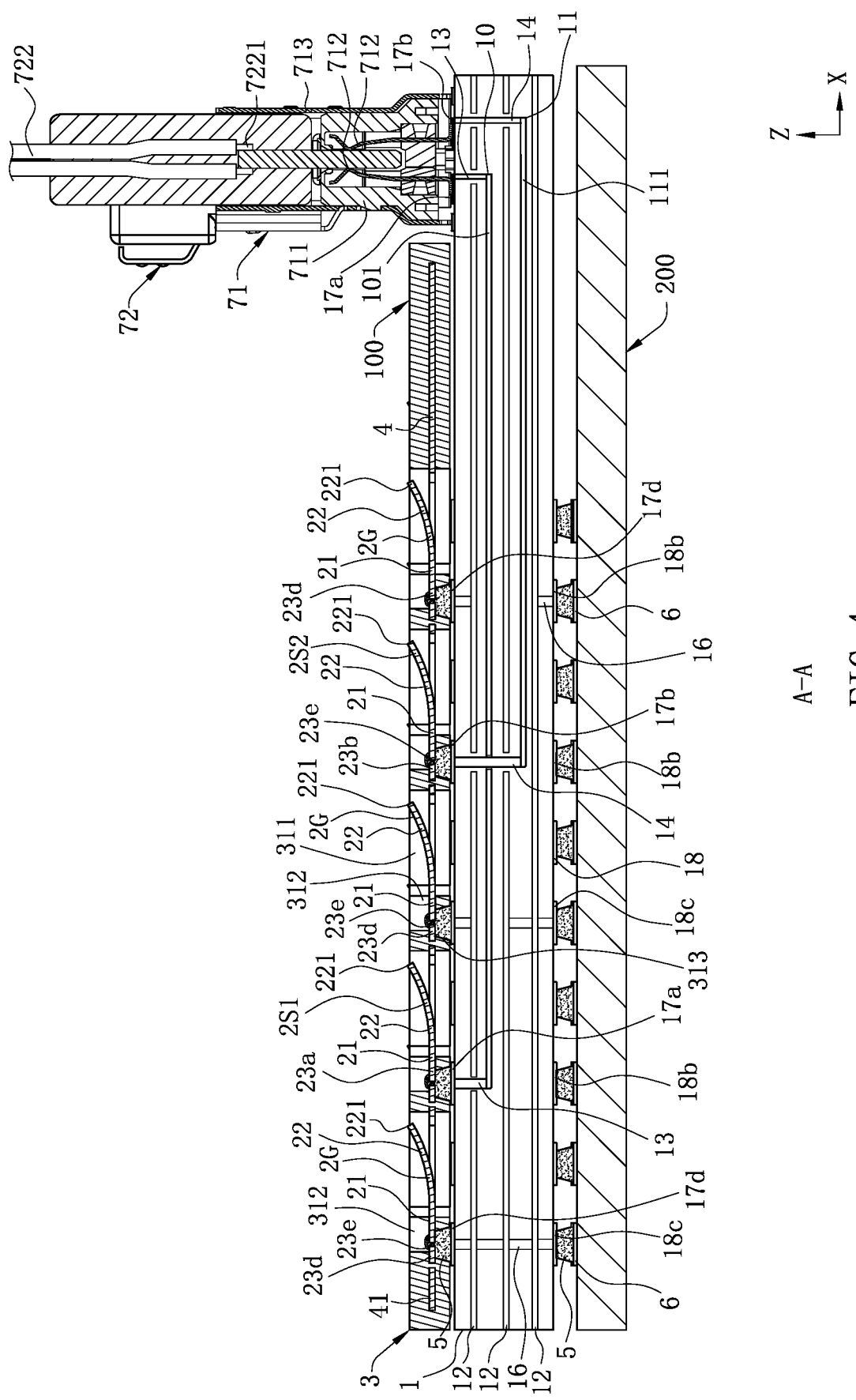
FIG. 4 is a sectional view of FIG. 3 along a line A-A.

As shown in FIG. 1, FIG. 2 and FIG. 4, the adapter board 1 is located above the circuit board 200 to be electrically connected to a cable assembly 7. The cable assembly 7 is mounted downward to the adapter board 1. In this embodiment, the cable assembly 7 includes a board end connector 71 and a cable end connector 72 mated with the board end connector 71. The board end connector 71 includes a plastic seat 711, a plurality of contact members 712 provided on the plastic seat 711 and a metal shell 713 wrapped outside the plastic seat 711. Some of the contact members 712 function as high speed contact members, others function as low speed contact members, and still some others function as grounding contact members. The contact members 712 are provided on the plastic seat 711 in a front row and a back row. The conductive terminals 2 are electrically connected to the adapter board 1. The cable assembly 7 are located at a front side of the conductive terminals 2 in the front-rear direction. The cable end connector 72 is inserted downward into the board end connector 71. The cable end connector 72 includes a plurality of conducting members 721 one-to-one conductively connected to the contact members 712 and a cable 722. The cable 722 includes a plurality of wires 7221 conductively connected to the conducting members 721 respectively. In other embodiments, the adapter board 1 may be directly connected to the cable end connector 72, or the wires 7221 of the cable 722 may be directly connected to the adapter board 1.

Figure 6:
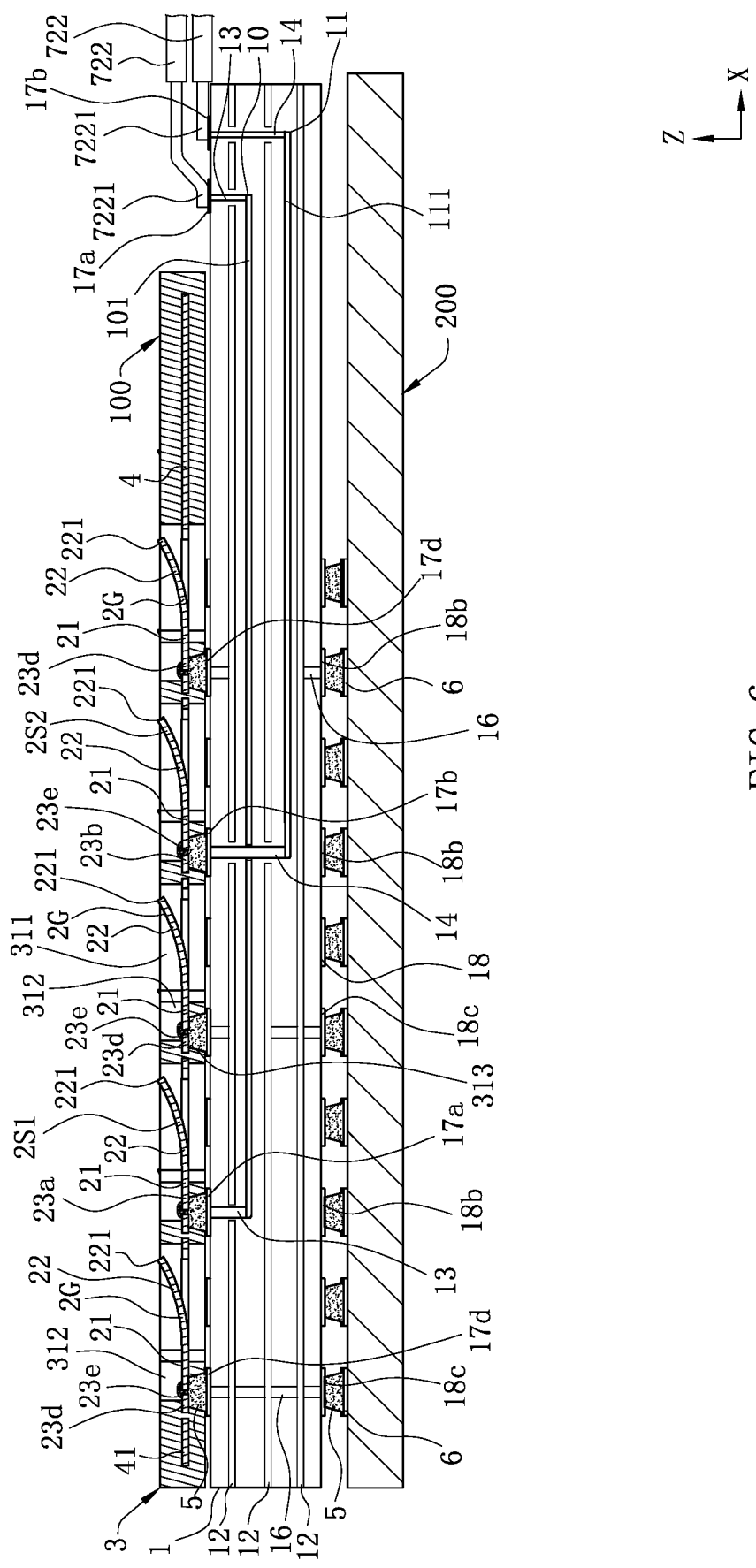
FIG. 6 is a schematic view of FIG. 3, where the cable is directly connected to the adapter board.

As shown in FIG. 4 and FIG. 6, the adapter board 1 includes a plurality of signal circuit layers and at least one grounding layer 12 located at different locations in the vertical direction. In this embodiment, the adapter board 1 is provided with a plurality of grounding layers 12, the signal circuit layers and the grounding layers 12 are provided one-by-one alternately in the vertical direction, and an upper side and a lower side of each signal circuit layer are respectively provided with corresponding grounding layers 12. In other embodiments, two grounding layers 12 or grounding layers 12 in other quantities may be provided between two adjacent signal circuit layers.

Figure 5:
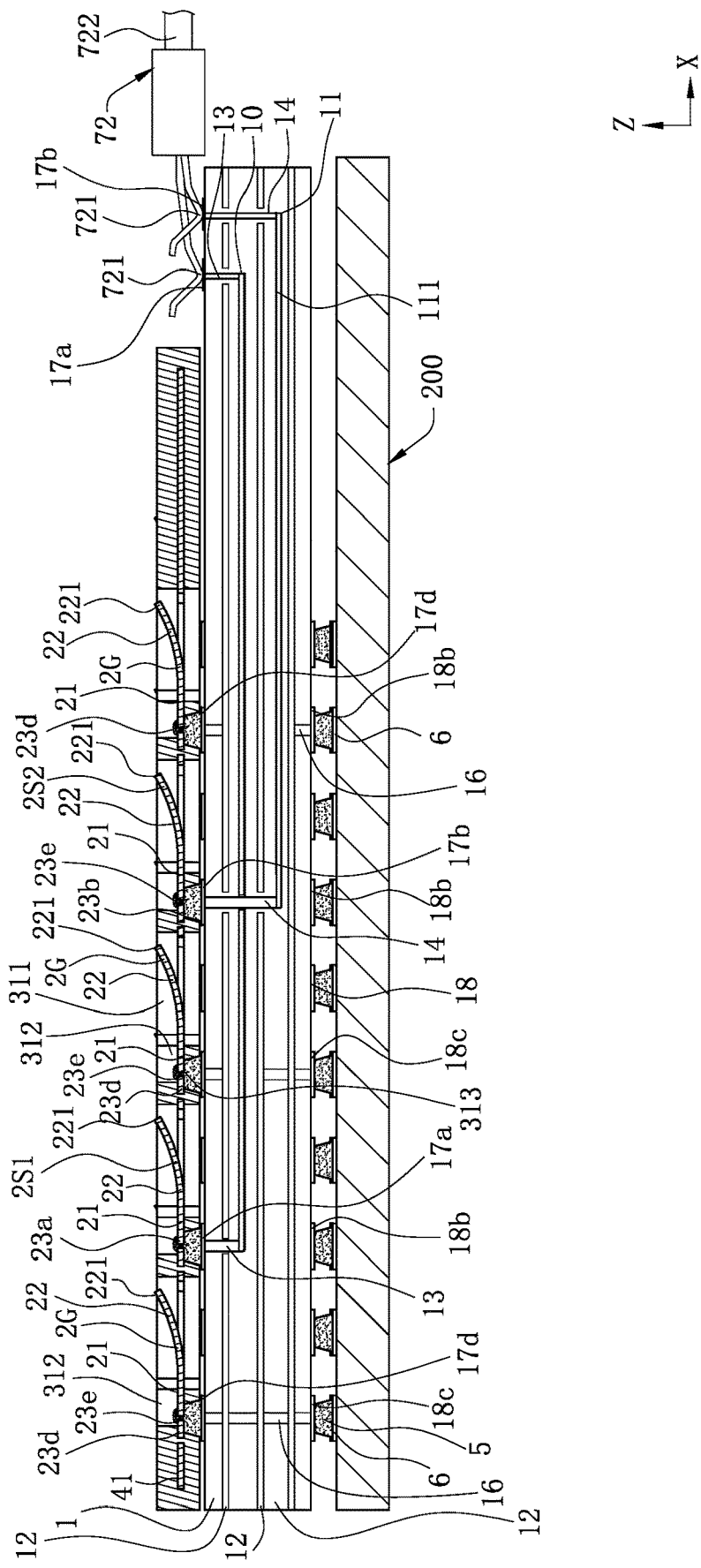
FIG. 5 is a schematic view of FIG. 3, where the cable end connector is directly connected to the adapter board.

As shown in FIG. 4, FIG. 5 and FIG. 6, the signal circuit layers include a first signal circuit layer 10 and a second circuit layer 11 located below the first signal circuit layer 10. In this embodiment, the adapter board 1 is only provided with two signal circuit layers, that is, the first signal circuit layer 10 and the second signal circuit layer 11. The first signal circuit layer 10 is the signal circuit layer being the closest to an upper surface of the adapter board 1, and the second signal circuit layer 11 is the signal circuit layer being the closest to a lower surface of the adapter board 1. In other embodiments, it is possible to provide only one grounding layer 12 located between the first signal circuit layer 10 and the second signal circuit layer 11. The required layers of the signal circuit layers may be provided based on the requirement.

As shown in FIG. 4, FIG. 5 and FIG. 6, the first signal circuit layer 10 includes at least one first high speed signal circuit 101, and the second signal circuit layer 11 includes at least one second high speed signal circuit 111. In this embodiment, the first signal circuit layer 10 includes at least one pair of first high speed signal circuits 101, and the second signal circuit layer 11 includes at least one pair of second high speed signal circuits 111. The pair of first high speed signal circuits 101 are used to transmit differential signals, and the pair of second high speed signal circuits 111 are used to transmit differential signals. The first high speed signal circuits 101 and the second high speed signal circuits 111 all substantially extend along the front-rear direction. In other embodiments, the first signal circuit layer 10 may include only the first high speed signal circuits 101 transmitting single-ended signals, or may include only the pair of first high speed signal circuits 101 transmitting differential signals, or may include both the first high speed signal circuits 101 transmitting single-ended signals and the pair of first high speed signal circuits 101 transmitting differential signals.

As shown in FIG. 4 and FIG. 6, the adapter board 1 includes at least one first high speed connecting circuit 13 and at least one second high speed connecting circuit 14 extending along the vertical direction. In this embodiment, a plurality of first high speed connecting circuits 13 and a plurality of second high speed connecting circuits 14 are provided, and all extend straightly along the vertical direction.

As shown in FIG. 4 and FIG. 6, each first high speed connecting circuit 13 extends downward from the upper surface of the adapter board 1, and passes through the grounding layer 12 located above the first signal circuit layer 10. In this embodiment, each first high speed connecting circuit 13 passes downward through only one grounding layer 12 and is connected to one of the first high speed signal circuits 101, and each of the two ends of each first high speed signal circuit 101 is connected to one of the first high speed connecting circuits 13. Thus, the quantity of the first high speed connecting circuits 13 is twice the quantity of the first high speed signal circuits 101, and the quantity of the second high speed connecting circuits 14 is twice the quantity of the second high speed signal circuits 111. Of the two ends of each first high speed signal circuit 101, the end away from the cable assembly 7 in the front-rear direction is defined as a starting end, and the end close to the cable assembly 7 in the front-rear direction is defined as a finishing end. Each first high speed connecting circuit 13 downward ends at the starting end or the finishing end of the corresponding first high speed signal circuit 101, thus preventing from forming an open-ended stub. The first high speed connecting circuits 13 and the grounding layer 12 are provided to be spaced apart. That is, the grounding layer 12 is provided with a plurality of reserved holes (not shown) corresponding to the first high speed connecting circuits 13, thus allowing the first high speed connecting circuits 13 to pass through the grounding layer 12 through the corresponding reserved holes, and preventing the first high speed connecting circuits 13 from short-circuiting with the grounding layer 12.

As shown in FIG. 4 and FIG. 6, each second high speed connecting circuit 14 extends downward from the upper surface of the adapter board 1, and passes through the first signal circuit layer 10 and at least one grounding layer 12 to be connected to one of the second high speed signal circuits 111. Each of the two ends of each second high speed signal circuit 111 is connected to one of the second high speed connecting circuits 14. Of the two ends of each second high speed signal circuit 111, the end away from the cable assembly 7 in the front-rear direction is defined as a starting end, and the end close to the cable assembly 7 in the front-rear direction is defined as a finishing end. Each second high speed connecting circuit 14 downward ends at the starting end or the finishing end of the corresponding second high speed signal circuit 111, thus preventing from forming an open-ended stub. In this embodiment, each second high speed connecting circuit 14 passes through two grounding layers 12. The second high speed connecting circuits 14 are provided to be spaced apart from the grounding layers 12 located above the second signal circuit layer 11 and the first signal circuit layer 10. That is, each grounding layer 12 located above the second signal circuit layer 11 is provided with a plurality of reserved holes (not shown) corresponding to the second high speed connecting circuits 14, thus allowing the second high speed connecting circuits 14 to pass through the grounding layer 12 through the corresponding reserved holes, and preventing the second high speed connecting circuits 14 from short-circuiting with the grounding layers 12 being passed therethrough. When the second high speed connecting circuits 14 pass downward through the first signal circuit layer 10, the first high speed signal circuits 101 on the first signal circuit layer 10 are provided to avoid the second high speed connecting circuits 14.

As shown in FIG. 4, FIG. 5 and FIG. 6, one of the first high speed connecting circuits 13 directly connects the finishing end of one of the first high speed signal circuits 101 and is electrically connected to one of the contact members 712, one of the conducting members 721 or one of the wires 7221. One of the second high speed connecting circuits 14 directly connects the finishing end of one of the second high speed signal circuits 111 and is electrically connected to one of the contact members 712, one of the conducting members 721 or one of the wires 7221.

As shown in FIG. 4, FIG. 5 and FIG. 6, in this embodiment, the first signal circuit layer 10 includes the pairs of the first high speed connecting circuits 13, and the second signal circuit layer 11 includes the pairs of the second high speed connecting circuits 14. That is, the pairs of the first high speed connecting circuits 13 are used to transmit differential signals, and the pairs of the second high speed connecting circuits 14 are used to transmit differential signals.

Figure 7:
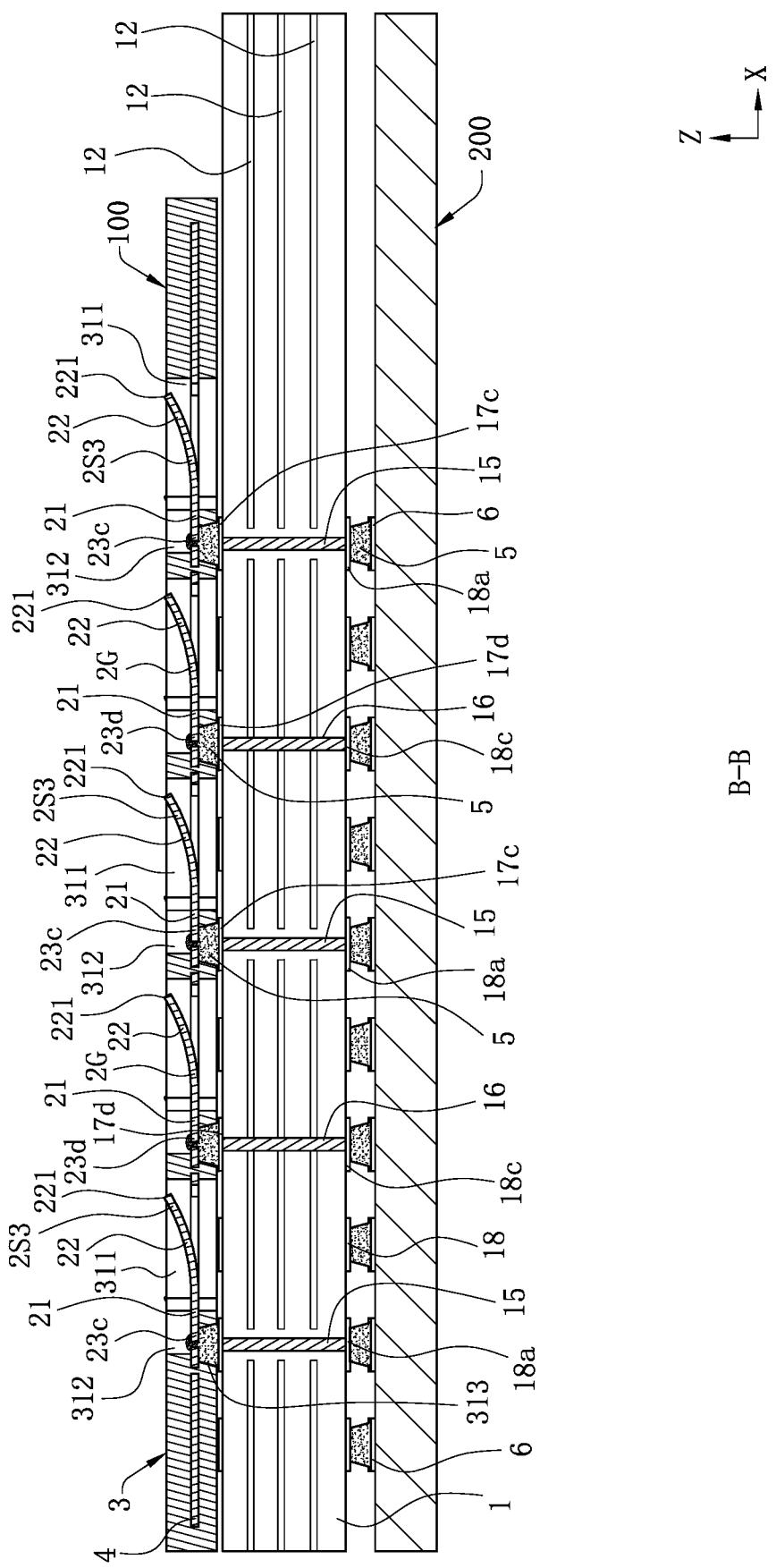
FIG. 7 is a sectional view of FIG. 3 along a line B-B.
Figure 8:
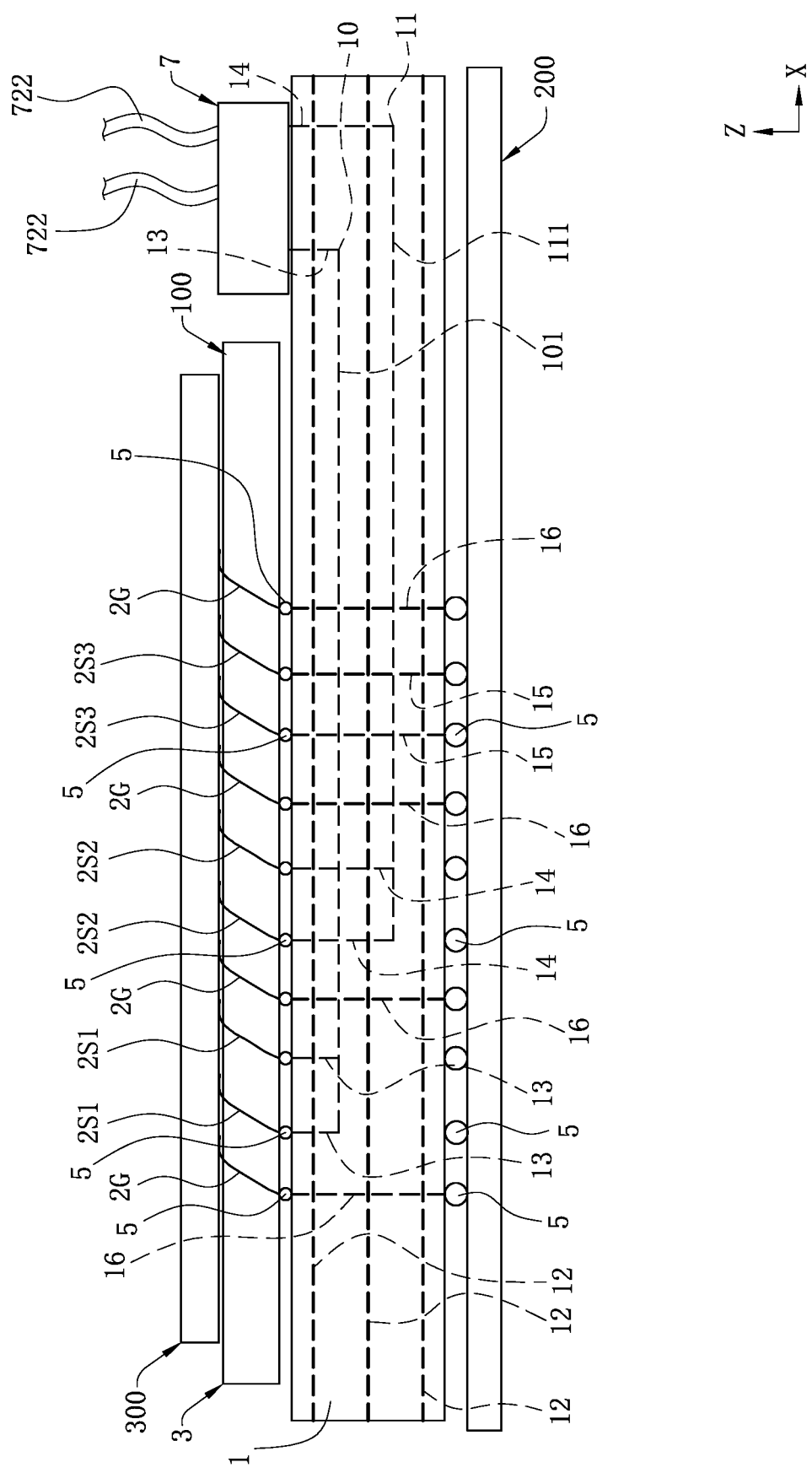
FIG. 8 is a circuit schematic view of FIG. 1 after the connector assembly is mated with the mating component and the circuit board.

As shown in FIG. 7 and FIG. 8, the adapter board 1 includes at least one low speed signal circuit 15 and at least one grounding circuit 16 extending between an upper surface and a lower surface thereof. Each low speed signal circuit 15 and each grounding circuit 16 are provided to be spaced apart. That is, each grounding layer 12 is provided with at least one reserved hole (not shown) corresponding to the low speed signal circuit 15, thus allowing the low speed signal circuit 15 to pass through the grounding layer 12 through the corresponding reserved hole, and preventing the low speed signal circuit 15 from short-circuiting with the grounding layer 12. In this embodiment, a plurality of reserved holes, a plurality of low speed signal circuits 15 and a plurality of grounding circuits 16 are provided. The adapter board 1 includes pairs of low speed signal circuits 15, and one pair of low speed signal circuits 15, one pair of first high speed signal circuits 13, or one pair of second high speed signal circuits 14 is provided between two grounding circuits 16 adjacent to each other in the front-rear direction. At least one of the grounding circuit 16 is located between the pair of first high speed signal circuits 13 and the pair of second high speed signal circuits 14 in the front-rear direction, and the grounding circuits 16 are provided at a rear side of each pair of the first high speed signal circuits 13 and at a front side of each pair of the second high speed signal circuits 14. The grounding circuits 16 pass downward through each signal circuit layer, and are connected to each grounding layer 12 to form a grounding path. The grounding circuits 16 are provided to avoid the first high speed signal circuits 101 and the second high speed signal circuits 111. The low speed wires 15 may only transmit single-ended signals, or may only be distributed in pairs to be used to transmit differential signals. It is also possible that some of the low speed wires 15 are used to transmit single-ended signals, and some other of the low speed wires 15 are distributed in pairs to be used to transmit differential signals.

As shown in FIG. 4, FIG. 5 and FIG. 6, the upper surface of the adapter board 1 is provided with a plurality of conductive sheets 17. Some of the conductive sheets 17 are provided to one-to-one correspond to the conductive terminals 2, and some other of the conductive sheets 17 are provided to one-to-one correspond to the contact members 712 of the cable assembly 7. The conductive sheets 17 provided to correspond to the first high speed connecting circuits 13 are defined as first high speed conductive sheets 17*a*. The conductive sheets 17 provided to correspond to the second high speed connecting circuits 14 are defined as second high speed conductive sheets 17*b*. The conductive sheets 17 provided to correspond to the low speed signal circuits 15 are defined as low speed signal conductive sheets 17*c*. The conductive sheets 17 provided to correspond to the grounding circuits 16 are defined as grounding conductive sheets 17*d*. Each first high speed conductive sheet 17*a* is connected to a top end of one of the first high speed connecting circuits 13 to form an electrical connection therebetween. Each second high speed conductive sheet 17*b* is connected to a top end of one of the second high speed connecting circuits 14 to form an electrical connection therebetween. An upper end of each low speed signal circuit 15 is conductively connected to one of the low speed signal conductive sheets 17*c*, and an upper end of each grounding circuit 16 is conductively connected to one of the grounding conductive sheets 17*d*. In other embodiments, yet some other of conductive sheets 17 may be directly conductively connected to the conductive members 721 of the cable end connector 72, or may be directly connected to the wires 7221 of the cable 722.

As shown in FIG. 4 and FIG. 5, the lower surface of the adapter board 1 includes a plurality of pads 18 having a quantity identical to a quantity of the conductive terminals 2. The pads 18 include at least one first pad 18*a*, a plurality of second pads 18*b* and at least one third pad 18*c*. In this embodiment, the pads 18 and the conductive sheets 17 corresponding to the conductive terminals 2 are one-to-one vertically correspondingly provided, and a plurality of first pads 18*a* and a plurality of third pads 18*c* are provided. Each third pad 18*c* is connected upward to one of the grounding circuits 16. Each low speed signal circuit 15 is connected upward to one of the low speed signal conductive sheets 17*c*, and is connected downward to one of the first pads 18*a*. Each second pad 18*b* vertically corresponds to one of the first high speed conductive sheets 17*a* or vertically corresponds to one of the second high speed conductive sheets 17*b*, and is not electrically connected thereto.

As shown in FIG. 1, FIG. 4 and FIG. 5, the circuit board 200 is provided with a plurality of solder pads 6 having a quantity identical to the quantity of the pads 18 and one-to-one vertically corresponding to the pads 18. Each pad 18 and a corresponding solder pad 6 are soldered and fixed by a solder 5. Each low speed signal conductive sheet 17*c* and each grounding conductive sheet 17*d* located on the lower surface of the adapter board 1 are all soldered downward to the solder pads 6 on the circuit board 200, thus forming electrical connections therebetween.

Figure 3:
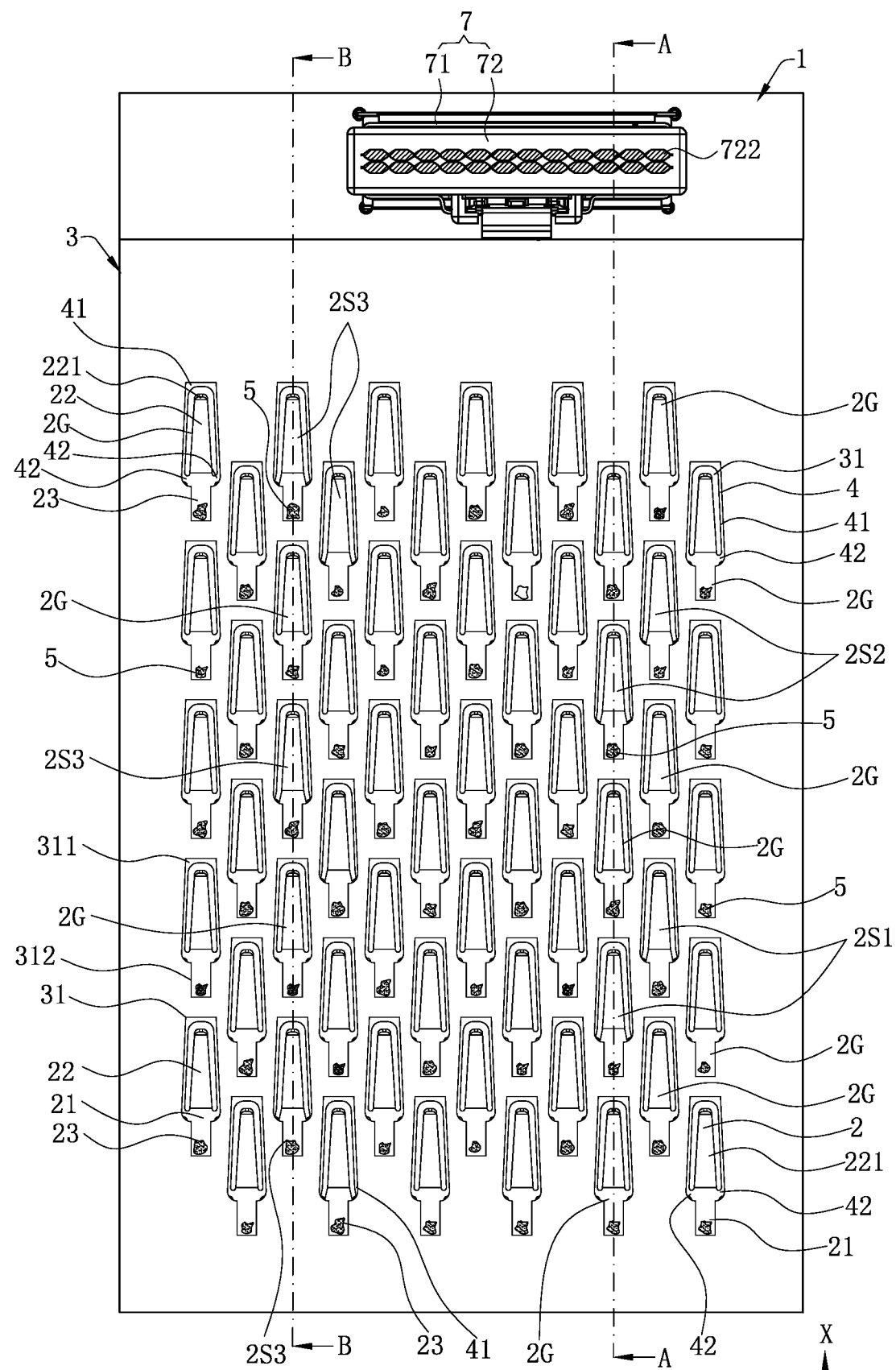
FIG. 3 is a top view of FIG. 2.

As shown in FIG. 3, FIG. 4 and FIG. 7, each conductive sheet 17 and its corresponding conductive terminal 2 are soldered and fixed by a solder 5. The quantity of the first high speed signal circuits 101 and the quantity of the second high speed signal circuits 111 are respectively identical to the quantities of the conductive terminals 2 being mated therewith. The conductive terminals 2 are formed by punching a metal plate (not shown). The conductive terminals 2 are provided in a plurality of rows in the front-rear direction, and the conductive terminals 2 in two adjacent rows in the front-rear direction are provided to be staggered. Each conductive terminal 2 includes a base portion 21 fixed to the insulating body 3, a contact arm 22 formed by extending forward from one end of the base portion 21, and a conductive portion 23 formed by extending backward from another end of the base portion 21. A front end of each contact arm 22 is provided with a contact portion 221. The base portion 21 and the conductive portion 23 are located on a same horizontal plane. The position of the base portion 21 is limited between the upper surface and the lower surface of the insulating body 3 in the vertical direction. Each conductive portion 23 is provided with a through hole 23*e* running vertically therethrough.

As shown in FIG. 4, FIG. 5 and FIG. 8, the conductive terminals 2 include a plurality of high speed signal terminals, at least one low speed signal terminal 2S3 and at least one ground terminal 2G. Each second pad 18*b* is not electrically connected to the high speed signal terminals and the low speed signal terminal 2S3. In this embodiment, a plurality of low speed signal terminals 2S3 and a plurality of ground terminals 2G are provided. The high speed signal terminals include at least one first high speed signal terminal 2S1 and at least one second high speed signal terminal 2S2. In this embodiment, a plurality of first high speed signal terminals 2S1 and a plurality of second high speed signal terminals 2S2 are provided, and the high speed signal terminals include a plurality of pairs of the first high speed signal terminals 2S1 and a plurality of pairs of the second high speed signal terminals 2S2. Further, a plurality of low speed signal terminals 2S3 are provided in pair, thus forming a plurality of pairs of the low speed signal terminals 2S3. The ground terminals 2G respectively surround each pair of the first high speed signal terminals 2S1, each pair of the second high speed signal terminals 2S2 and each pair of the low speed signal terminals 2S3. The conductive portion 23 of each first high speed signal terminal 2S1 is defined as a first conductive portion 23*a*. In each pair of the first high speed signal terminals 2S1, one of the first conductive portions 23*a* is located behind the other of the first conductive portions 23*a*, and each first conductive portion 23*a* is soldered to a corresponding one of the first high speed conductive sheets 17*a* through a solder 5. In this embodiment, the first conductive portion 23*a* is electrically connected to the corresponding first high speed conductive sheet 17*a* by surface-mount technology (SMT). The conductive portion 23 of each second high speed signal terminal 2S2 is defined as a second conductive portion 23*b*. In each pair of the second high speed signal terminals 2S2, one of the second conductive portions 23*b* is located behind the other of the second conductive portions 23*b*, and each second conductive portion 23*b* is soldered to a corresponding one of the second high speed conductive sheets 17*b* through a solder 5. In this embodiment, the second conductive portion 23*b* is electrically connected to the corresponding second high speed conductive sheet 17*b* by SMT. The conductive portion 23 of each low speed signal terminal 2S3 is defined as a third conductive portion 23*c*. In each pair of the low speed signal terminals 2S3, one of the third conductive portions 23*c* is located behind the other of the third conductive portions 23c, and each third conductive portion 23c is soldered to a corresponding one of the low speed conductive sheets 17c through a solder 5. The conductive portion 23 of each ground terminal 2G is defined as a fourth conductive portion 23d. Each fourth conductive portion 23d is soldered to a corresponding one of the grounding conductive sheets 17d through a solder 5, and is electrically connected to the grounding layer 12.

As shown in FIG. 4, FIG. 5 and FIG. 8, one pair of the first high speed signal terminals 2S1 is located behind one pair of the second high speed signal terminals 2S2, the starting ends of the first high speed signal circuits 101 correspondingly electrically connected to the first high speed signal terminals 2S1 located therebehind are located behind the starting ends of the second high speed signal circuits 111 correspondingly electrically connected to the second high speed signal terminals 2S2 located in front thereof, and the finishing ends of the first high speed signal circuits 101 correspondingly electrically connected to the first high speed signal terminals 2S1 located therebehind are located behind the finishing ends of the second high speed signal circuits 111 correspondingly electrically connected to the second high speed signal terminals 2S2 located in front thereof. The lengths of the first high speed signal circuits 101 correspondingly electrically connected to the first high speed signal terminals 2S1 located therebehind in the front-rear direction are greater than the lengths of the second high speed signal circuits 111 correspondingly electrically connected to the second high speed signal terminals 2S2 located in front thereof. Thus, the first high speed signal terminals 2S1 located therebehind are electrically connected with one of the contact members 712 in the back row through the corresponding first high speed signal circuit 101 (which is longer) and the corresponding first high speed connecting circuit 13 (which is shorter), and the second high speed signal terminals 2S2 located in front thereof are electrically connected with one of the contact members 712 in the front row through the corresponding second high speed signal circuit 111 (which is shorter) and the corresponding second high speed connecting circuit 14 (which is longer), such that the transmission length from the high speed signal terminals to the corresponding contact members 712 or the conductive members 721 or the wires 7221 of the cable assembly 7 are substantially equal, which is conducive to high frequency transmission.

As shown in FIG. 4, FIG. 5 and FIG. 8, a first high speed signal terminal 2S1 of one pair of the first high speed signal terminals 2S1 is located right behind a second high speed signal terminal 2S2 of one pair of the second high speed signal terminals 2S2, and the two terminals are separated by at least one of the ground terminals 2G. At least one of the ground terminals 2G is provided at each of the front and rear sides of the first high speed signal terminals 2S1 and each of the front and rear sides of the second high speed signal terminals 2S2, and two low speed signal terminals 2S3 adjacent to each other in the front-rear direction are separated by at least one of the ground terminals 2G.

As shown in FIG. 2 and FIG. 4, the insulating body 3 is located above the adapter board 1, the cable assembly 7 is located in front of the insulating body 3, and the conductive terminals 2 and the metal sheet 4 are all insert-molded to the insulating body 3. In other embodiments, it is possible to only provide the cable end connector 72 to be located in front of the insulating body 3 and directly connected to the adapter board 1, or to directly provide the cable 722 to be located in front of the insulating body 3 and directly connected to the adapter board 1.

Figure 9:
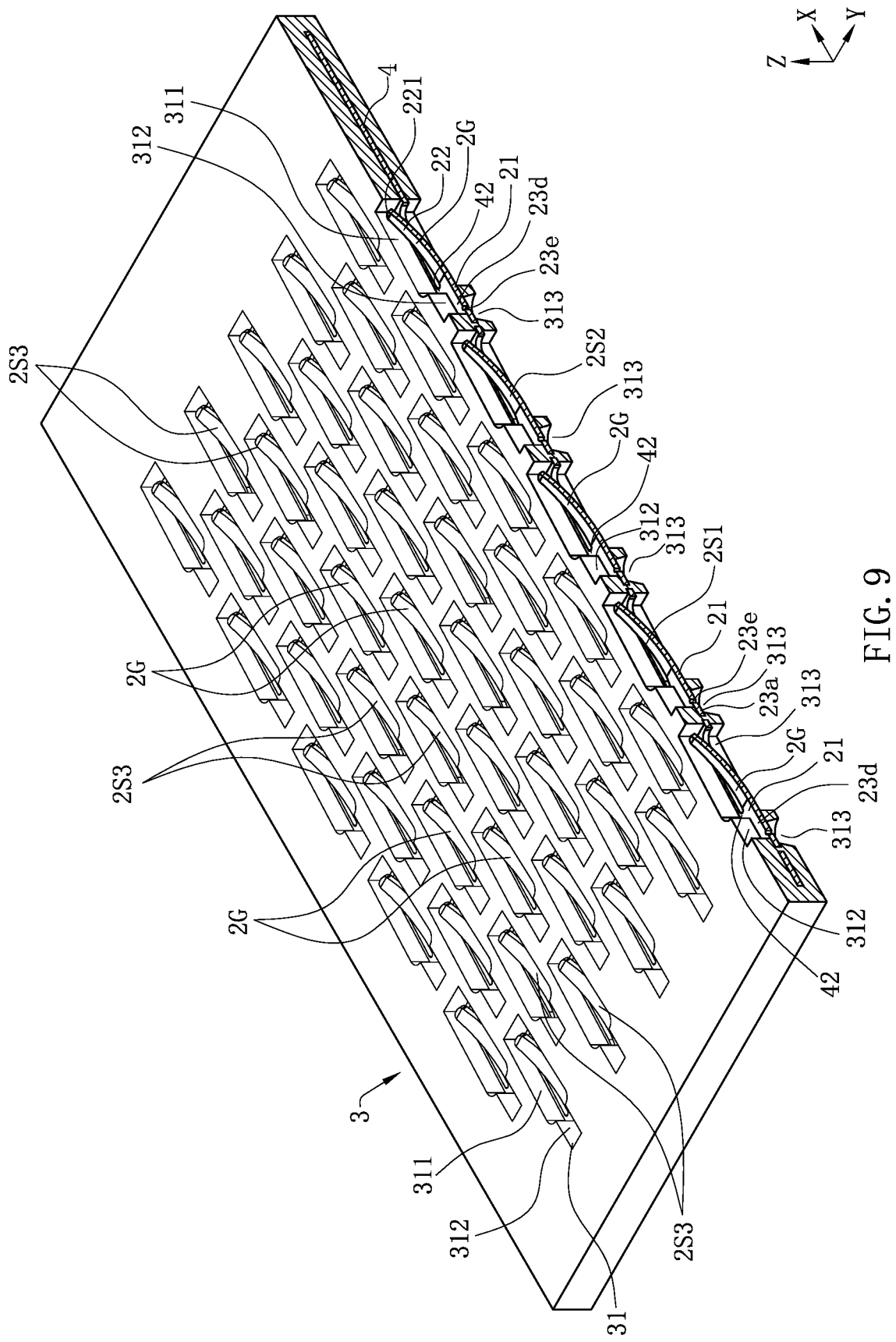
FIG. 9 is a perspective sectional view of FIG. 1 showing only the insulating body, the terminals and the metal sheet.

As shown in FIG. 3, FIG. 4 and FIG. 9, the insulating body 3 is provided with a plurality of accommodating holes 31 running through the upper surface and the lower surface thereof. The accommodating holes 31 are provided in a plurality of rows in the front-rear direction, and the accommodating holes 31 in the two rows adjacent to each other in the front-rear direction are provided to be staggered. Each accommodating hole 31 includes a first hole 311, a second hole 312 and a third hole 313. The first hole 311 runs vertically through the insulating body 3. The first holes 311 of the accommodating holes 31 one-to-one correspondingly accommodate the contact arms 22. The contact portions 221 protrude upward out of the insulating body 3 to be conductively connected to the mating component 300. The second hole 312 is formed by being downward concavely provided on the upper surface of the insulating body 3, and the third hole 313 is formed by being upward concavely provided on the lower surface of the insulating body 3. The second hole 312 is in communication with the first hole 311 in the front-rear direction, and is in downward communication with the third hole 313. The first hole 311 is located in front of the second hole 312, and the first hole 311 and the third hole 313 are provided to be spaced apart in the front-rear direction. One of the second holes 312 in the front row is located between the two adjacent first holes 311 in the adjacent back row in the left-right direction. The base portion 21 and the conductive portion 23 are both accommodated in the second hole 312, and the base portion 21 and the conductive portion 23 are both at least partially embedded in the insulating body 3. Each through hole 23e is exposed upward to a corresponding second hole 312 and exposed downward to a corresponding third hole 313. The corresponding solder 5 located above the conductive sheet 17 protrudes upward into the corresponding third hole 313 and is soldered to the corresponding conductive portion 23. The solder 5 enters the through hole 23e and covers the upper surface of the conductive portion 23, and the conductive portion 23 is fixed to the adapter board 1 by the corresponding solder 5.

Figure 10:
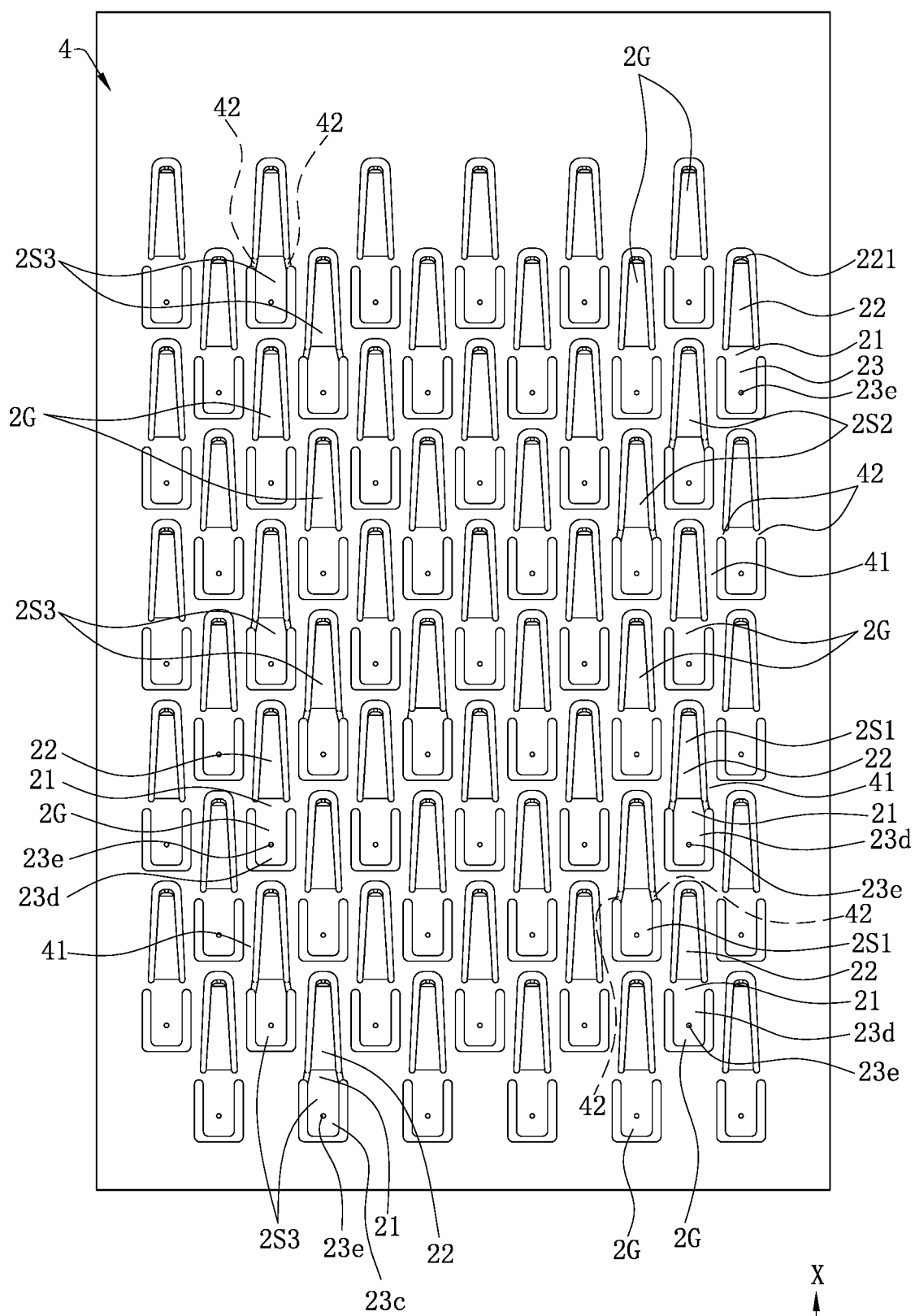
FIG. 10 is a top view of the terminals and the metal sheet in FIG. 1.

As shown in FIG. 3, FIG. 7 and FIG. 10, the metal sheet 4 surrounds the conductive terminals 2. The metal sheet 4 includes a base plate 41 and a plurality of connecting portions 42. The base plate 41 surrounds outside each of the conductive terminals 2. Each two connecting portions 42 are connected to a left side and a right side of one of the ground terminals 2G. The connecting portions 42 correspondingly connected to the high speed signal terminals and the low speed signal terminals 2S3 are shown in dotted lines, indicating that they have been cut and removed. Each connecting portion 42 is provided at a connecting location of the base portion 21 and the contact arm 22, and is exposed to the corresponding first hole 311. The metal sheet 4 is provided to be spaced apart from the first high speed signal terminals 2S1, the second high speed signal terminals 2S2 and the low speed signal terminal 2S3. Thus, the metal sheet 4 may perform electromagnetic shielding to the first high speed signal terminals 2S1, the second high speed signal terminals 2S2 and the low speed signal terminal 2S3, thereby enhancing the high frequency characteristics of the signal terminals.

As shown in FIG. 3, FIG. 7 and FIG. 10, in this embodiment, the conductive terminals 2 are formed from a metal plate to form a semi-finished member. At this time, each of the left side and the right side of each conductive terminal 2 is provided with the connecting portion 42 connected to the base plate 41, and other portions of each conductive terminal 2 are broken from the base plate 41 to form gaps therebetween. Then, the semi-finished member and the insulating body 3 are insert-molded. Lastly, by laser cutting, the connecting portions correspondingly provided for the first high speed signal terminals 2S1, the second high speed signal terminals 2S2 and the low speed signal terminal 2S3 are removed, forming the metal sheet 4 being connected to the ground terminals 2G. The metal sheet 4 and the conductive terminals 2 are formed by punching the same metal plate, such that the material thereof is identical.

Figure 11:
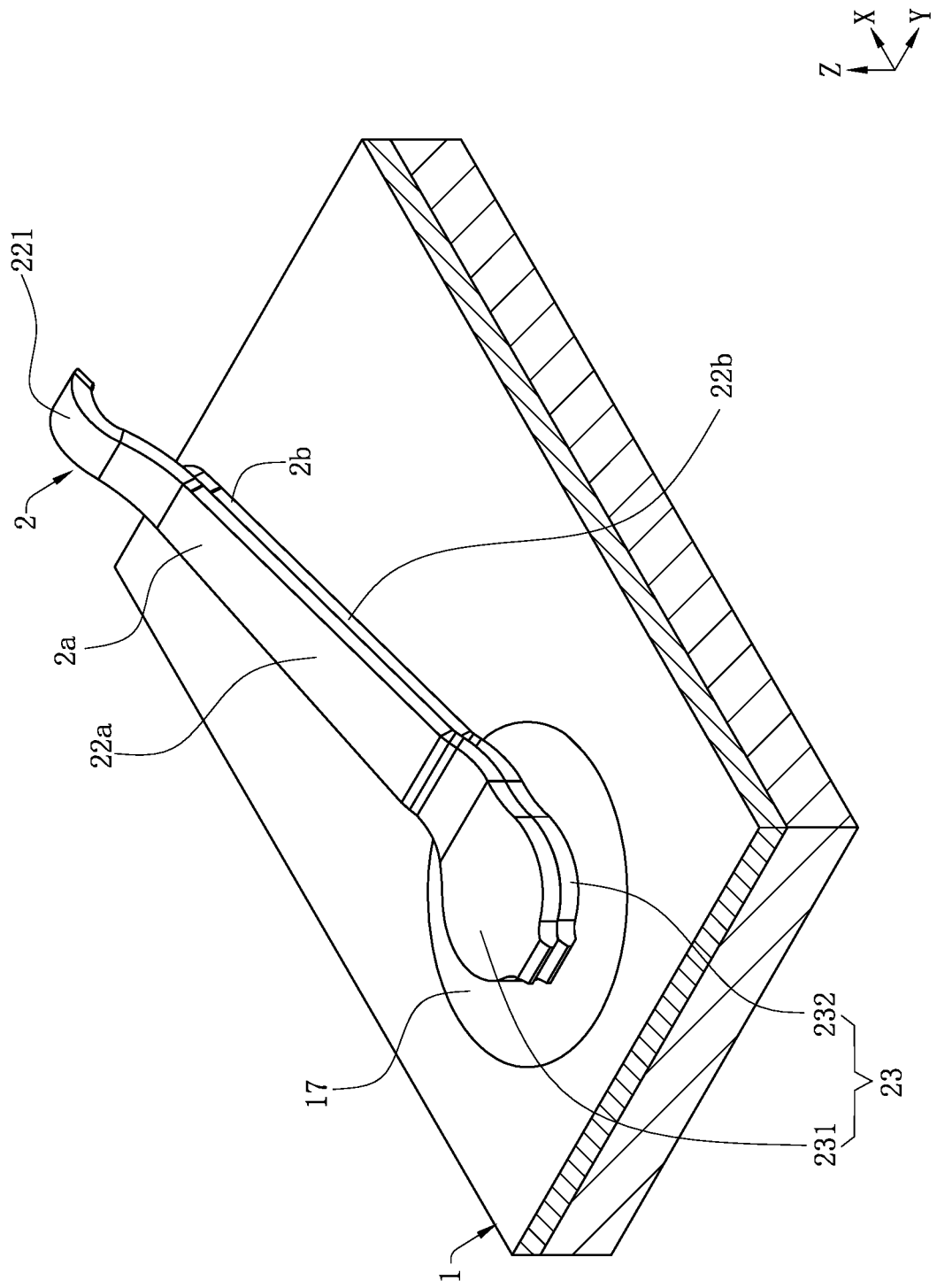
FIG. 11 is a perspective view of conductive terminals and an adapter board of a connector assembly according to a second embodiment of the present invention.

FIG. 11 shows conductive terminals 2 and an adapter board 1 of a connector assembly according to a second embodiment of the present invention, which is different from the first embodiment in that: the conductive portion 23 of each conductive terminal 2 is fixed to the adapter board 1 directly by soldering without providing the insulating body 3, and each conductive terminal 2 includes a first terminal 2a and a second terminal 2b formed individually. In other embodiments, it is possible that some of the conductive terminals 2 include a first terminal 2a and a second terminal 2b formed individually. The first terminal 2a is provided with a first leg 231 and a first contact arm 22a formed by extending upward from the first leg 231, and the contact portion 221 is formed on the first contact arm 22a. The second terminal 2b includes a second leg 232 and a second contact arm 22b formed by extending upward from the second leg 232. The first leg 231 and the second leg 232 are attached to each other vertically. The second leg 232 is located below the first leg 231 and is downward soldered to the corresponding conductive sheet 17. The first leg 231 and the second leg 232 may be fixed by soldering fixing or other adhering technology. The first contact arm 22a and the second contact arm 22b are attached to each other without gaps therebetween. The second contact arm 22b upward abuts the first contact arm 22a, and the second contact arm 22b extends along the first contact arm 22a and ends before reaching the contact portion 221. That is, the second contact arm 22b is not upward attached to the contact portion 221, thereby increasing the elasticity of the contact portion 221. In this embodiment, the widths of the portions of the second terminal 2b and the first terminal 2a attached together are substantially equal. Other structures of the connector assembly 100 are identical to those in the first embodiment, and are thus not further elaborated.

As shown in FIG. 11, each first high speed signal terminal 2S1, each second high speed signal terminal 2S2, each low speed signal terminal 2S3 or each ground terminal 2G may adopt the structure of the conductive terminal 2 formed altogether by the first terminal 2a and the second terminal 2b.

Figure 12:
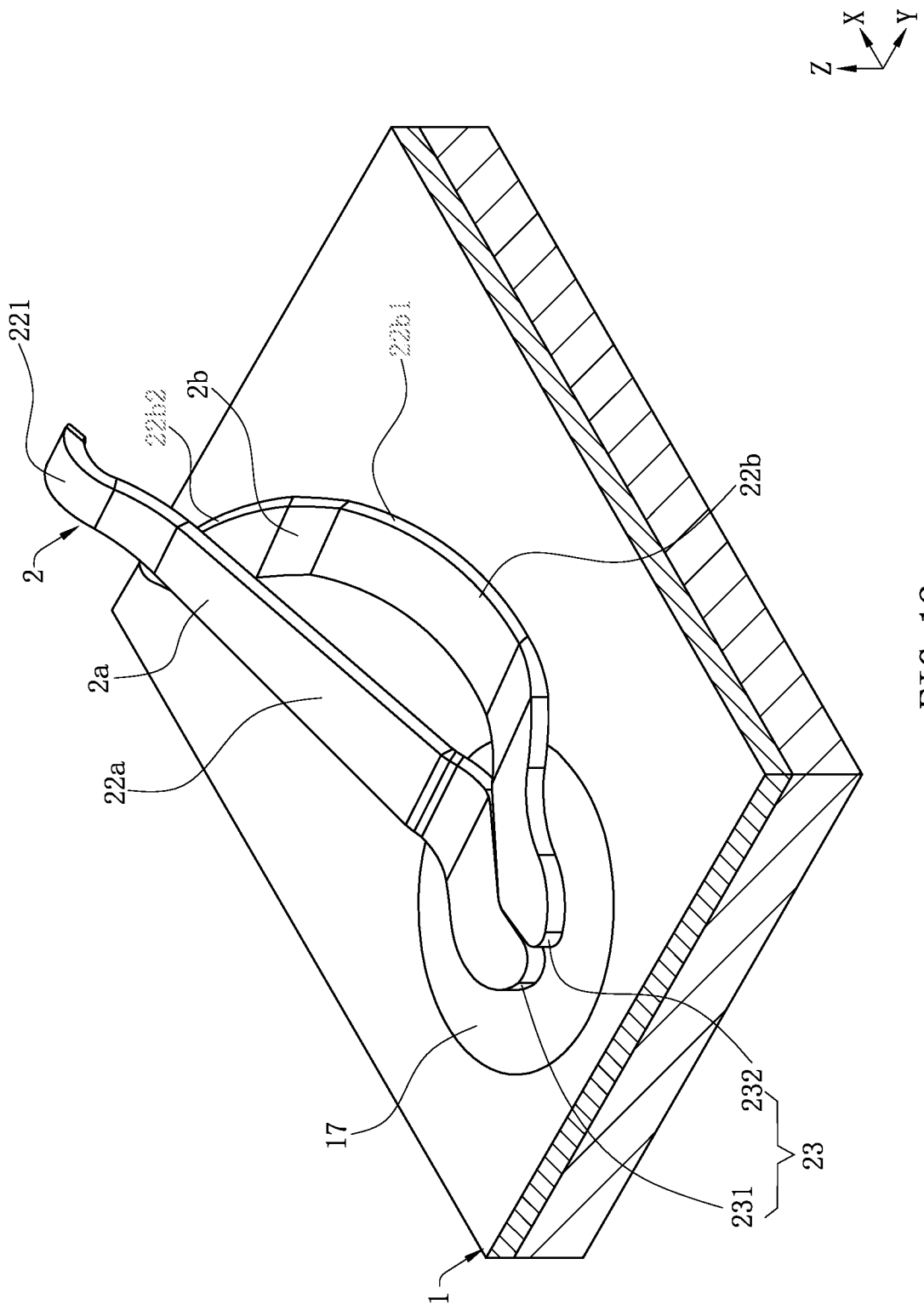
FIG. 12 is a perspective view of conductive terminals and an adapter board of a connector assembly according to a third embodiment of the present invention.

FIG. 12 shows conductive terminals 2 and an adapter board 1 of a connector assembly according to a third embodiment of the present invention, which is different from the second embodiment in that: the first leg 231 and the second leg 232 are provided to be horizontally side-by-side, and are altogether soldered downward to a same one of the conductive sheets 17. The second contact arm 22b has a first arm 22b1 located at one side of the first contact arm 22a and a second arm 22b2 bending and extending from the first arm 22b1 and extending to be below the first contact arm 22a. That is, the first arm 22b1 is not provided at the lower side of the first contact arm 22a, and viewing from the left-right direction, the two components partially overlap. The second arm 22b2 upward abuts the first contact arm 22a, thereby increasing a normal force by the first contact arm 22a upward abutting the mating component 300.

Figure 13:
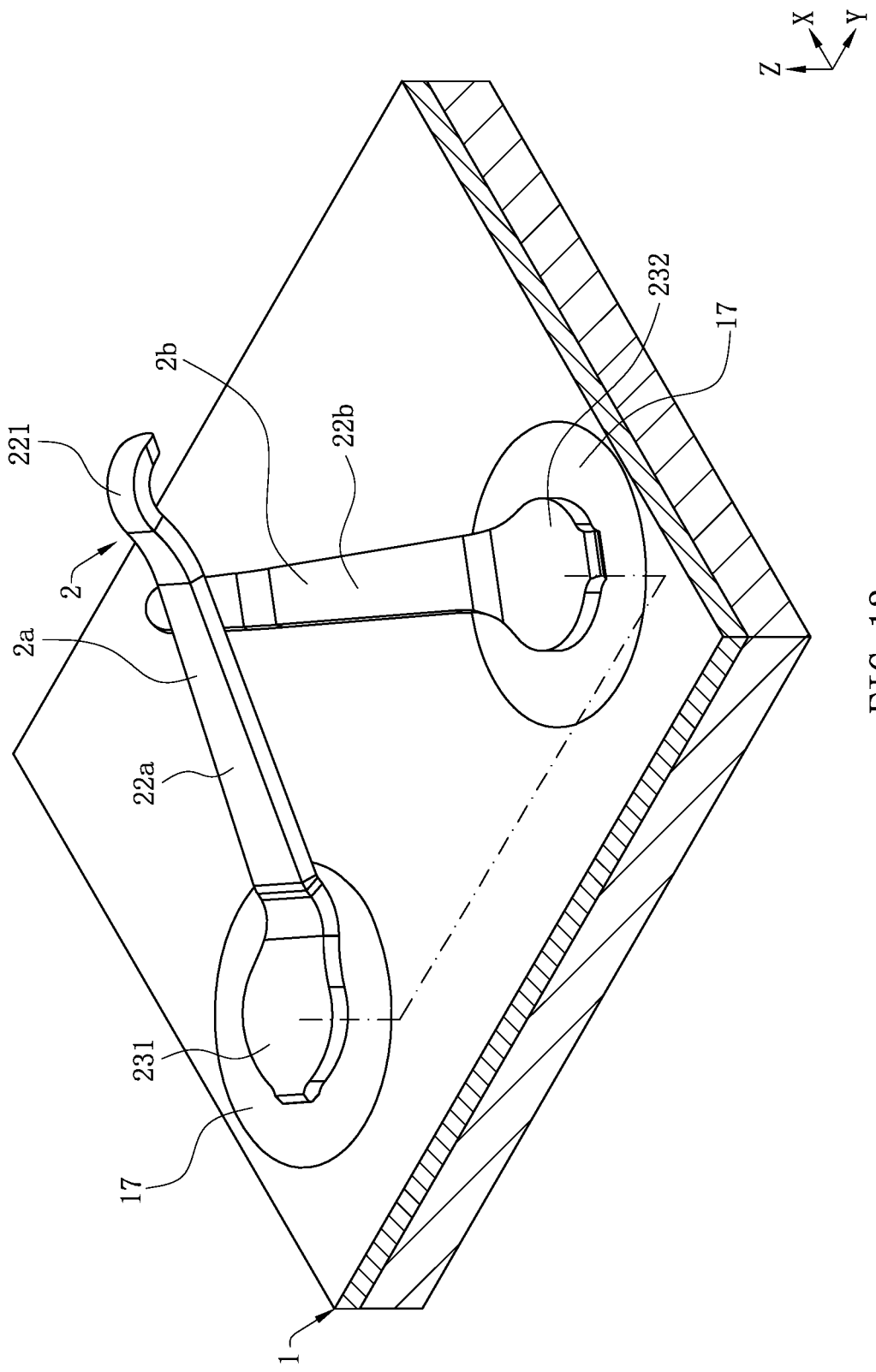
FIG. 13 is a perspective view of conductive terminals and an adapter board of a connector assembly according to a fourth embodiment of the present invention.

FIG. 13 shows a connector assembly 100 according to a fourth embodiment of the present invention, which is different from the second embodiment in that: the adapter board 1 is provided with the conductive sheets 17 respectively corresponding to and conductively connected to the first leg 231 and the second leg 232. The conductive sheet 17 conductively connected to the first leg 231 and the conductive sheet 17 conductively connected to the second leg 232 are provided to be spaced apart on the adapter board 1 and are electrically connected to each other. In other embodiments, the second terminal 2b may function to only support the first terminal 2a. That is, the first leg 231 and the second leg 232 are not electrically connected.

FIG. 14 to FIG. 18 show a connector assembly 100 according to a fifth embodiment of the present invention. The connector assembly 100 is used to electrically connect a mating component 300 to a circuit board 200. The connector assembly 100 includes an adapter board 1 and a plurality of conductive terminals 2 accommodated in the adapter board 1. In this embodiment, the mating component 300 is a chip module. In other embodiments, the mating component 300 may be other types of components.

Figure 14:
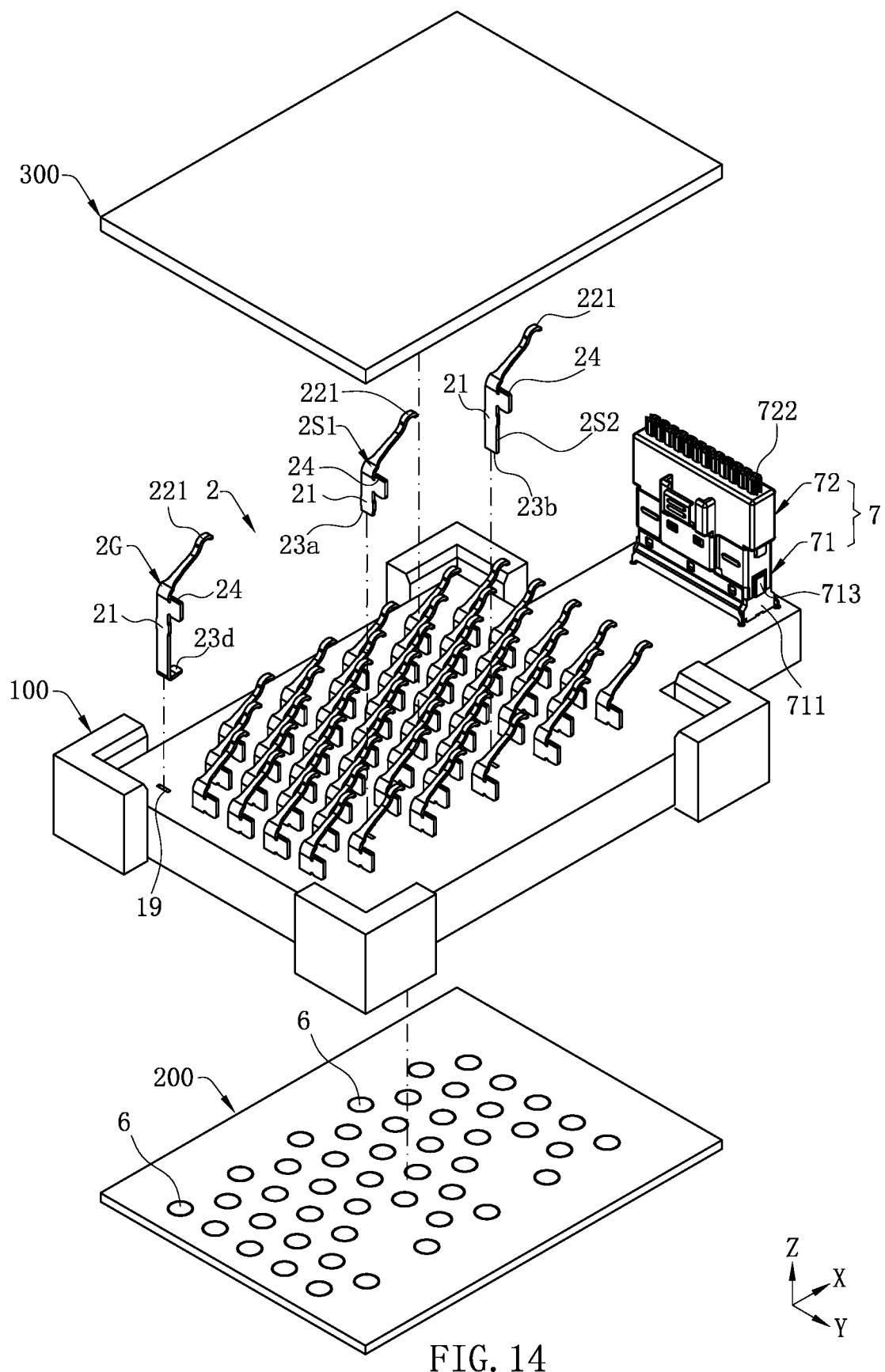
FIG. 14 is a perspective exploded view of a connector assembly, a mating component and a circuit board according to a fifth embodiment of the present invention.
Figure 15:
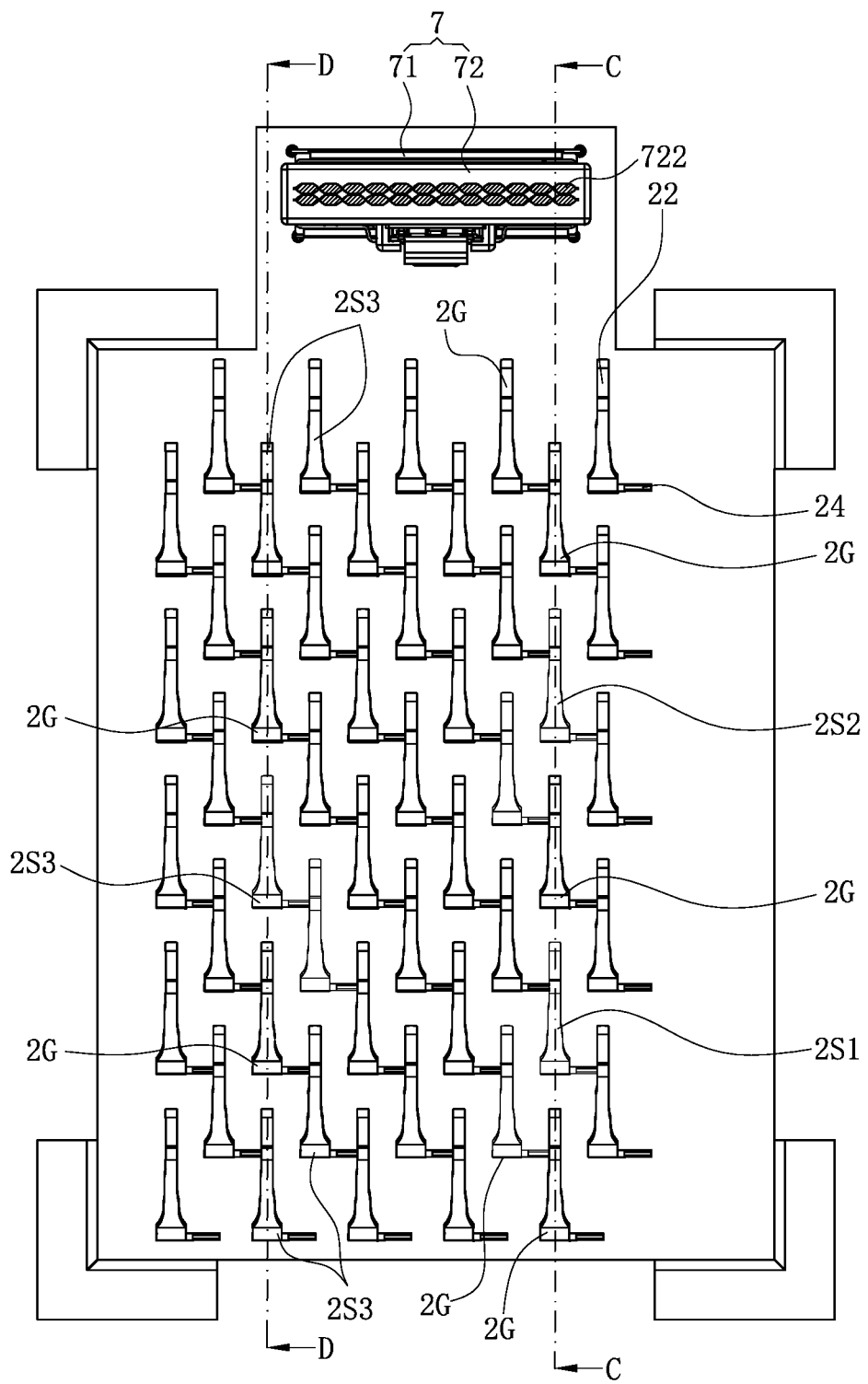
FIG. 15 is a top view of the connector assembly in FIG. 14.

As shown in FIG. 14 and FIG. 15, the adapter board 1 is located above the circuit board 200 to be connected to a cable assembly 7. The cable assembly 7 is mounted downward to the adapter board 1, and the conductive terminals 2 are accommodated in the adapter board 1. The cable assembly 7 are located at a front side of the conductive terminals 2 in the front-rear direction. The structure of the cable assembly 7 is identical to that of the first embodiment, and is not further elaborated.

Figure 16:
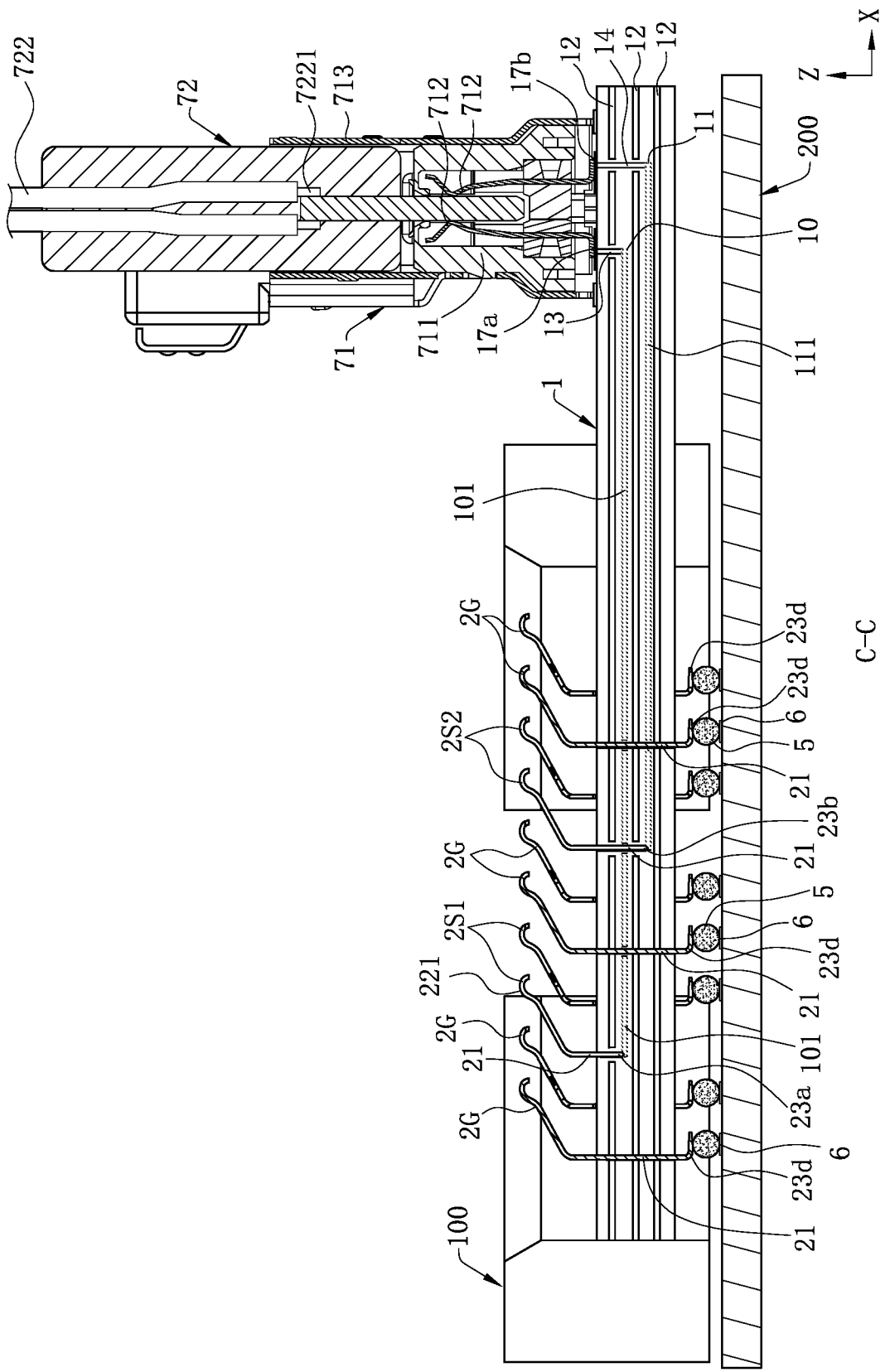
FIG. 16 is a sectional view of FIG. 15 along a line C-C.
Figure 17:
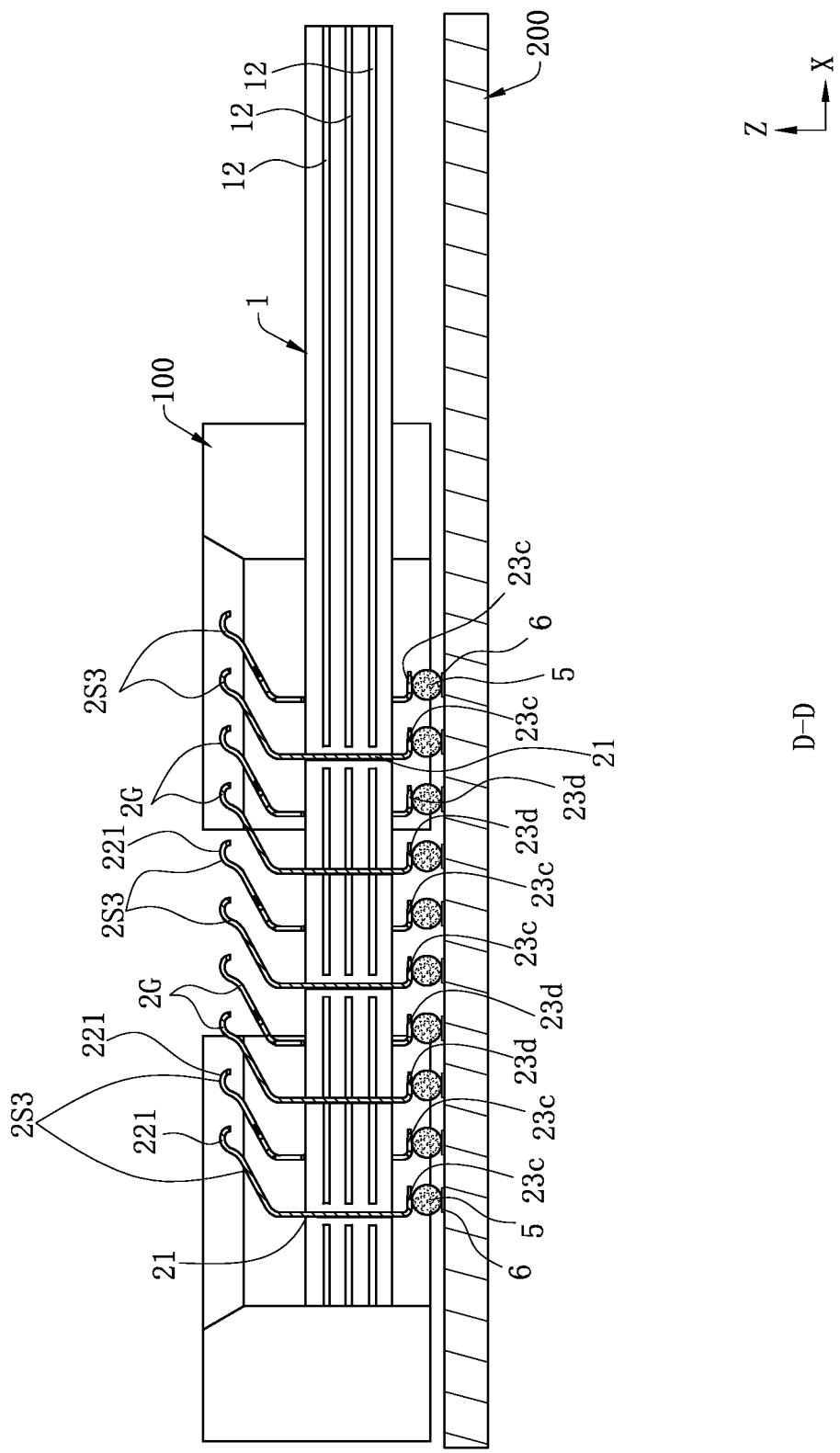
FIG. 17 is a sectional view of FIG. 15 along a line D-D.

As shown in FIG. 16 and FIG. 17, the adapter board 1 includes a plurality of signal circuit layers and at least one grounding layer 12 located at different locations in the vertical direction. In this embodiment, the adapter board 1 is provided with a plurality of grounding layers 12, the signal circuit layers and the grounding layers 12 are provided one-by-one alternately in the vertical direction, and an upper side and a lower side of each signal circuit layer are respectively provided with corresponding grounding layers 12. In other embodiments, two grounding layers 12 or grounding layers 12 in other quantities may be provided between two adjacent signal circuit layers.

Figure 18:
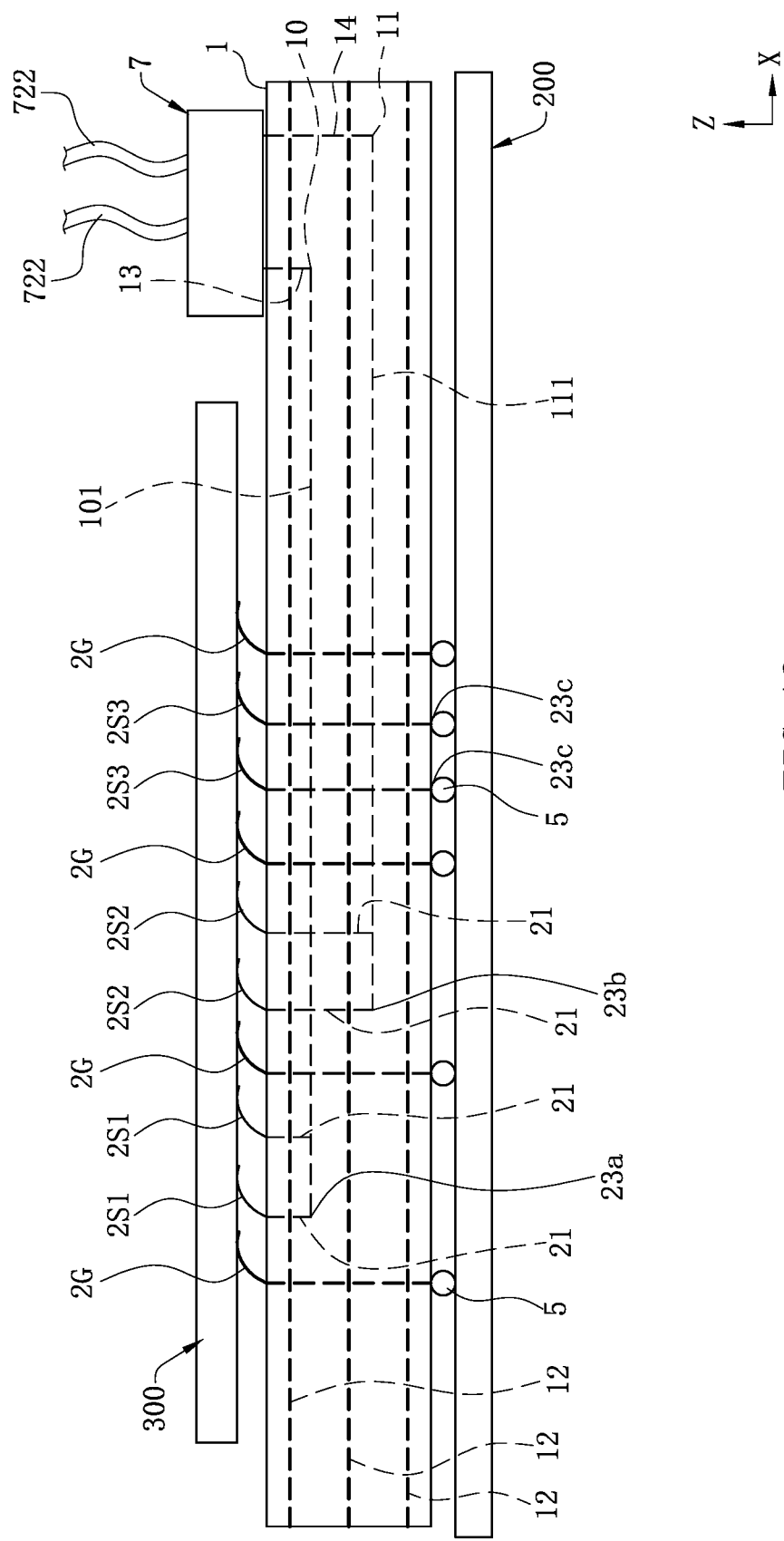
FIG. 18 is a circuit schematic view of FIG. 14 after the connector assembly is mated with the mating component and the circuit board.

As shown in FIG. 16 and FIG. 18, the signal circuit layers include a first signal circuit layer 10 and a second circuit layer 11 located below the first signal circuit layer 10. In this embodiment, the adapter board 1 is only provided with two signal circuit layers, that is, the first signal circuit layer 10 and the second signal circuit layer 11. The first signal circuit layer 10 is the signal circuit layer being the closest to an upper surface of the adapter board 1, and the second signal circuit layer 11 is the signal circuit layer being the second closest to the upper surface of the adapter board 1. In other embodiments, it is possible to provide only one grounding layer 12 located between the first signal circuit layer 10 and the second signal circuit layer 11. The required layers of the signal circuit layers may be provided based on the requirement.

As shown in FIG. 16 and FIG. 18, the first signal circuit layer 10 includes at least one first high speed signal circuit 101, and the second signal circuit layer 11 includes at least one second high speed signal circuit 111. In this embodiment, the first signal circuit layer 10 includes at least one pair of first high speed signal circuits 101, and the second signal circuit layer 11 includes at least one pair of second high speed signal circuits 111. The pair of first high speed signal circuits 101 are used to transmit differential signals, and the pair of second high speed signal circuits 111 are used to transmit differential signals. The first high speed signal circuits 101 and the second high speed signal circuits 111 all substantially extend along the front-rear direction. In other embodiments, the first signal circuit layer 10 may include only the first high speed signal circuits 101 transmitting single-ended signals, or may include only the pair of first high speed signal circuits 101 transmitting differential signals, or may include both the first high speed signal circuits 101 transmitting single-ended signals and the pair of first high speed signal circuits 101 transmitting differential signals.

As shown in FIG. 16, the adapter board 1 includes a plurality of first high speed connecting circuits 13 and a plurality of second high speed connecting circuits 14 extending along the vertical direction. In this embodiment, the first high speed connecting circuits 13 and the second high speed connecting circuits 14 all extend straightly along the vertical direction. A quantity of the first high speed connecting circuits 13 and a quantity of the first high speed signal circuits 101 are identical, and a quantity of the second high speed connecting circuits 14 and a quantity of the second high speed signal circuits 111 are identical.

As shown in FIG. 16, each first high speed connecting circuit 13 extends downward from the upper surface of the adapter board 1, and passes through at least one of the grounding layers 12, and is connected to the cable assembly 7 and one of the first high speed signal circuits 101. The first high speed connecting circuits 13 and the grounding layers 12 are provided to be spaced apart. That is, each grounding layer 12 is provided with a plurality of reserved holes (not shown) corresponding to the first high speed connecting circuits 13, thus allowing the first high speed connecting circuits 13 to pass through the grounding layer 12 through the corresponding reserved holes, and preventing the first high speed connecting circuits 13 from short-circuiting with the grounding layers 12. In other embodiments, the first high speed connecting circuits 13 may be connected to the conducting members 721 or the wires 7221, which is identical to the first embodiment, and is thus not further elaborated.

As shown in FIG. 16, each second high speed connecting circuit 14 extends downward from the upper surface of the adapter board 1, and passes through at least one grounding layer 12 and the first signal circuit layer 10 to be connected to the cable assembly 7 and one of the second high speed signal circuits 111. In this embodiment, each second high speed connecting circuit 14 passes through two grounding layers 12. The first high speed connecting circuits 13 are provided to be spaced apart from the grounding layers 12 and the first signal circuit layer 10. That is, each grounding layer 12 is provided with a plurality of reserved holes (not shown) corresponding to the second high speed connecting circuits 14, thus allowing the second high speed connecting circuits 14 to pass through the grounding layer 12 through the corresponding reserved holes, and preventing the second high speed connecting circuits 14 from short-circuiting with the grounding layers 12. In other embodiments, the second high speed connecting circuits 14 may be connected to the conducting members 721 or the wires 7221, which is identical to the first embodiment, and is thus not further elaborated.

As shown in FIG. 16, of a front end and a rear end of each first high speed signal circuit 101 and a front end and a rear end of each second high speed signal circuit 111, respectively, the end away from the cable assembly 7 in the front-rear direction is defined as a starting end, and the end close to the cable assembly 7 in the front-rear direction is defined as a finishing end. Each first high speed connecting circuit 13 is upward electrically connected to one of the contact members 712 and downward ends at the finishing end of a corresponding one of the first high speed signal circuits 101, and each second high speed connecting circuit 14 is upward electrically connected to another one of the contact members 712 and downward ends at the finishing end of a corresponding one of the second high speed signal circuits 111, thus preventing from forming an open-ended stub.

As shown in FIG. 16 and FIG. 18, the adapter board 1 includes the pairs of the first high speed connecting circuits 13 and the pairs of the second high speed connecting circuits 14. That is, the pairs of the first high speed connecting circuits 13 are used to transmit differential signals, and the pairs of the second high speed connecting circuits 14 are used to transmit differential signals.

As shown in FIG. 14, FIG. 16 and FIG. 17, the adapter board 1 is provided with a plurality of accommodating slots 19 formed by being downward concavely provided on the upper surface thereof. A quantity of the accommodating slots 19 and the quantity of the conductive terminals 2 are identical. Some of the accommodating slots 19 are through hole structures running downward through the adapter board 1, and some other accommodating slots 19 are blinded hole structures. The conductive terminals 2 are one-to-one correspondingly accommodated in the accommodating slots 19.

As shown in FIG. 14, FIG. 16 and FIG. 17, each conductive terminal 2 is provided with a base portion 21 accommodated in a corresponding accommodating slot 19, a conductive portion 23 formed by extending downward from the base portion 21, a contact portion 211 formed by extending upward from the base portion 21 and a strip connecting portion 24 formed by extending from one of the left side and the right side of the base portion 21. The strip connecting portion 24 is used to be connected to a strip (not shown). The strip connecting portion 24 extends horizontally outward to an upper location of the upper surface of the adapter board 1 outside the corresponding accommodating slot 19. The contact portion 221 is located above the adapter board 1 to be conductively connected to the mating component 300.

As shown in FIG. 14, FIG. 16 and FIG. 17, the conductive terminals 2 include a plurality of high speed signal terminals, at least one low speed signal terminal 2S3 and at least one ground terminal 2G. In this embodiment, a plurality of low speed signal terminals 2S3 and a plurality of ground terminals 2G are provided. The high speed signal terminals include at least one first high speed signal terminal 2S1 and at least one second high speed signal terminal 2S2. In this embodiment, a plurality of first high speed signal terminals 2S1 and a plurality of second high speed signal terminals 2S2 are provided, and the high speed signal terminals include a plurality of pairs of the first high speed signal terminals 2S1 and a plurality of pairs of the second high speed signal terminals 2S2. Further, a plurality of low speed signal terminals 2S3 are provided in pair, thus forming a plurality of pairs of the low speed signal terminals 2S3. The conductive portion 23 of each first high speed signal terminal 2S1 is defined as a first conductive portion 23a, the conductive portion 23 of each second high speed signal terminal 2S2 is defined as a second conductive portion 23b, the conductive portion 23 of each low speed signal terminal 2S3 is defined as a third conductive portion 23c, and the conductive portion 23 of each ground terminal 2G is defined as a fourth conductive portion 23d. The first conductive portions 23a and the second conductive portions 23b are all accommodated in the corresponding accommodating slots 19 that are blind hole structures, and the bottom end of the first conductive portion 23a is located above the bottom end of the second conductive portion 23b. Each first conductive portion 23a downward ends at the starting end of one of the first high speed signal circuits 101, and each second conductive portion 23b downward ends at the starting end of one of the second high speed signal circuits 111, thus preventing from forming an open-ended stub. Each third conductive portion 23c and each fourth conductive portion 23d all exposed downward to the adapter board 1, and are all flat plate structure extending horizontally. The circuit board 200 is provided with a solder pad 6 corresponding to each third conductive portion 23c and each fourth conductive portion 23d respectively. Each third conductive portion 23c and each fourth conductive portion 23d are respectively solder to the corresponding solder pads 6 on the circuit board 200 through the solders 5. The circuit board 200 does not provide any solder pad 6 corresponding to the first conductive portions 23a and the second conductive portions 23b.

As shown in FIG. 14 and FIG. 15, a first high speed signal terminal 2S1 of one pair of the first high speed signal terminals 2S1 is located behind a second high speed signal terminal 2S2 of one pair of the second high speed signal terminals 2S2, and in the front-rear direction, the first high speed signal terminal 2S1 and the second high speed signal terminal 2S2 are separated by at least one of the ground terminals 2G. At least one of the ground terminals 2G is provided at each of the front side of the first high speed signal terminals 2S1 and the rear side of the second high speed signal terminals 2S2, and two low speed signal terminals 2S3 adjacent to each other in the front-rear direction are separated by at least one of the ground terminals 2G.

As shown in FIG. 16 and FIG. 17, the base portion 21 of each first high speed signal terminal 2S1 runs downward through at least one grounding layer 12. The base portion 21 of each first high speed signal terminal 2S1 and the grounding layer 12 are provided to be spaced apart. That is, the grounding layer 12 is provided with a plurality of reserved holes (not shown) corresponding to the first high speed signal terminals 2S1, thus allowing the first high speed signal terminals 2S1 to pass through the grounding layer 12 through the corresponding reserved holes, and preventing the first high speed signal terminals 2S1 from short-circuiting with the grounding layer 12.

As shown in FIG. 16 and FIG. 17, the base portion 21 of each second high speed signal terminal 2S2 runs downward through at least one grounding layer 12 and the first signal circuit layer 10. The base portion 21 of each second high speed signal terminal 2S2 and the grounding layer 12 are provided to be spaced apart. That is, the grounding layer 12 is provided with a plurality of reserved holes (not shown) corresponding to the second high speed signal terminals 2S2, thus allowing the second high speed signal terminals 2S2 to pass through the grounding layer 12 through the corresponding reserved holes, and preventing the second high speed signal terminals 2S2 from short-circuiting with the grounding layer 12. When the base portion 21 of each of the second high speed signal terminal 2S2 runs through the corresponding first high speed signal circuit 101, the first high speed signal circuits 101 are provided to avoid the base portion 21 of each second high speed signal terminal 2S2.

In sum, the connector assembly according to certain embodiments of the present invention has the following beneficial effects:

(1) Each first high speed signal terminal 2S1 is provided with the first conductive portion 23a, each second high speed signal terminal 2S2 is provided with the second conductive portion 23b, and each low speed signal terminal 2S3 is provided with the third conductive portion 23c. The adapter board 1 includes a plurality of signal circuit layers located at different heights in the vertical direction. The signal circuit layers include a first signal circuit layer 10 and a second signal circuit layer 11 located below the first signal circuit layer 10. The first signal circuit layer 10 of the adapter board 1 includes at least one first high speed signal circuit 101 electrically connecting the first conductive portion 23a and a conductive wire 7221 of the cable 722. The second signal circuit layer 11 of the adapter board includes at least one second high speed signal circuit 111 electrically connecting the second conductive portion 23b and another conductive wire 7221 of the cable 722. The third conductive portion 23c is electrically connected to the circuit board 200. By distributing the high speed signal circuits in the signal circuit layers at different heights, it is conducive to reducing the crosstalk interferences between the signal circuit layers in the high speed signal transmission process. The high speed signal circuits and the low speed signal circuits 15 are electrically connected to different components, that is, the high speed signal circuits may be adapted to the cable end connector 72 assembly without going through the circuit board 200, thus preventing from being adapted all through the circuits on the circuit board 200 such that the circuits on the circuit board 200 become arranged too densely and too long and affecting the signal transmission effect, and satisfying the usage requirements of the connector assembly 100 to the high frequency characteristics.

(2) One of the grounding layers 12 is located between the first signal circuit layer 10 and the second signal circuit layer 11, and the fourth conductive portion 23d of each ground terminal 2G is electrically connected to the grounding layers 12, which is conducive to reducing the crosstalk interferences.

(3) The first conductive portion 23a of each first high speed signal terminal 2S1 downward ends at the starting end of the corresponding first high speed signal circuit 101 away from the cable assembly 7, and each second conductive portion 23b downward ends at the starting end of the corresponding second high speed signal circuit 111 away from the cable assembly 7, thus preventing from the generation of the open stub effect to affect signal transmission.

(4) The adapter board 1 is provided with a plurality of accommodating slots 19 formed by being downward concavely provided on the upper surface thereof, thus reducing the provision of the insulating body 3, and the conductive terminals 2 are directly fixed to the adapter board 1. Each conductive terminal 2 is provided with a base portion 21 accommodated in the corresponding accommodating slot 19, and each conductive terminal 2 includes a strip connecting portion 24 provided on at least one side of the base portion 21. The strip connecting portion 24 extends horizontally outward to an upper location of the upper surface of the adapter board 1 outside the corresponding accommodating slot 19, preventing each conducting terminal 2 from being excessively inserted downward into the accommodating slot 19 of the adapter board 1 and in contact with the signal circuit layer or the grounding layer 12, to which no electrical connection should be formed.

(5) The conductive portion 23 and the corresponding base portion 21 of each conductive terminal 2 are located on a same horizontal plane, and the position of the base portion 21 is limited between the upper surface and the lower surface of the insualting body 3, which is conducive to reducing the height of the product and satisfying the miniaturization need of the product.

(6) The portion of each conductive portion 23 exposed to the insulating body 3 is provided with at least one through hole 23e running vertically. The solder 5 enters the through hole 23e and covers the upper surface of the conductive portion 23, and the conductive portion 23 is fixed to the adapter board 1 by the solder 5, preventing the conductive portion 23 from easily warping upward and breaking from the solder 5 when the mating component 300 presses the contact portion 221 downward, and causing the electrical conductive connection between the conductive portion 23 and the corresponding conductive sheet 17 not to facilitate.

(7) Each ground terminal 2G is connected to the metal sheet 4. After the conductive terminals 2 and the metal sheet are embedded in the insulating body 3 through insert-molding, the metal sheet 4 is provided to be spaced apart from the first high speed signal terminals 2S1, the second high speed signal terminals 2S2 and the low speed signal terminals 2S3, which is convenient for the insert-molding technology of the conductive terminals 2, the metal sheet 4 and the insulating body 3, and simultaneously enhances the shielding effect of the metal sheet 4 to the signal terminals.

(8) The metal sheet 4 is provided with the connecting portion 42 connected to each conductive terminal 2. Each connecting portion 42 is provided is provided at a connecting location of the base portion 21 and the contact arm 22, and is exposed to the corresponding accommodating hole 31, which is conducive to cutting the connecting portions 42 corresponding to the first high speed signal terminals 2S1, the second high speed signal terminals 2S2 and the low speed signal terminals 2S3 after the conductive terminals 2 are insert-molded to the insulating body 3, and reserving the connecting portions 42 corresponding to the ground terminals 2G.

(9) The first hole 311 and the third hole 313 are provided to be horizontally spaced apart, such that the solder 5 accommodated and provided in the third hole 313, when heated, does not easily flow toward the first hole 311 accommodating the corresponding contact arm 22, thus preventing the solder 5 to climb to the portion of the contact arm 22 in contact with the mating component 300.

(10) The lower surface of the adapter board 1 includes a plurality of pads 18 having the quantity identical to the quantity of the conductive terminals 2. The pads 18 include the first pads 18a, the second pads 18b and the third pads 18c. Each first pad 18a is electrically connected to one of the low speed signal terminals 2S3, and each third pad 18c is electrically connected to one of the ground terminals 2G. Each second pad 18b is not electrically connected to the high speed signal terminals and the low speed signal terminals 2S3. The circuit board 200 is provided with a plurality of solder pads 6 having the quantity identical to the quantity of the pads 18 and one-to-one vertically corresponding to the pads 18. Each pad 18 and the corresponding solder pad 6 are soldered and fixed by the solder 5. Thus, by adding the second pads 18b at the locations corresponding to the high speed signal terminals, the soldering area between the adapter board 1 and the circuit board 200 is increased, and the fixing and connection therebetween are strengthened.

(11) Each conductive terminal 2 includes the first terminal 2a and the second terminal 2b formed individually. The second contact arm 22b of the second terminal 2b upward abuts the first contact arm 22a, and the contact portion 221 of the first contact arm 22a upward abuts the mating component 300. The first leg 231 and the second leg 232 altogether form the conductive portion 23 electrically connected to the conductive sheet 17. Thus, compared to the structure where the conductive terminal 2 is provided as a single terminal, and the normal force abutted the mating component 300 is insufficient, by adding the second terminal 2b to abut the first terminal 2a, the normal force by the first terminal 2a upward abutting the mating component 300 is increased.

(12) The first leg 231 and the second leg 232 are attached to each other vertically, the first contact arm 22a and the second contact arm 22b are attached to each other, and the second contact arm 22b extends along the first contact arm 22a and ends before reaching the contact portion 221, thus increasing the supporting force for the first contact arm 22a and ensuring the elasticity of the contact portion 221.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A connector assembly, configured to electrically connect a mating component to a circuit board, the connector assembly comprising:
    a plurality of conductive terminals, wherein each of the conductive terminals is provided with a contact portion and a conductive portion, the conductive terminals comprise a plurality of high speed signal terminals and at least one low speed signal terminal, the high speed signal terminals comprise at least one first high speed signal terminal and at least one second high speed signal terminal, the conductive portion of the first high speed signal terminal is defined as a first conductive portion, the conductive portion of the second high speed signal terminal is defined as a second conductive portion, and the conductive portion of the low speed signal terminal is defined as a third conductive portion; and
    an adapter board, located above the circuit board and configured to be conductively connected to a cable directly or indirectly, wherein the contact portion is located above the adapter board and configured to be electrically connected to the mating component, the adapter board comprises a plurality of signal circuit layers located at different heights in a vertical direction, the signal circuit layers comprise a first signal circuit layer and a second signal circuit layer located below the first signal circuit layer, the first signal circuit layer comprises at least one first high speed signal circuit electrically connecting the first conductive portion and a conductive wire of the cable, the second signal circuit layer comprises at least one second high speed signal circuit electrically connecting the second conductive portion and another conductive wire of the cable, and the third conductive portion is electrically connected to the circuit board.

2. The connector assembly according to claim 1, wherein the conductive terminals further comprise at least one ground terminal, the conductive portion of the ground terminal is defined as a fourth conductive portion, the adapter board further comprises at least one grounding layer, one of the at least one grounding layer is located between the first signal circuit layer and the second circuit layer, and the fourth conductive portion is electrically connected to the grounding layer.

3. The connector assembly according to claim 2, wherein the third conductive portion and the fourth conductive portion are both exposed on a lower surface of the adapter board and are respectively soldered to the circuit board.

4. The connector assembly according to claim 1, wherein the high speed signal terminals comprises a plurality of pairs of first high speed signal terminals and a plurality of pairs of second high speed signal terminals, each pair of the first high speed signal terminals and each pair of the second high speed signal terminals are configured to transmit differential signals, the first signal circuit layer comprises a plurality of pairs of first high speed signal circuits, and the second signal circuit layer comprises a plurality of pairs of second high speed signal circuits.

5. The connector assembly according to claim 1, wherein the conductive portion is located at a lower end of each of the conductive terminals, the first conductive portion downward ends at one end of the corresponding first high speed signal circuit, and the second conductive portion downward ends at one end of the corresponding second high speed signal circuit.

6. The connector assembly according to claim 1, wherein the adapter board is provided with a plurality of accommodating slots formed by being downward concavely provided on an upper surface thereof, the accommodating slots correspondingly accommodate the conductive terminals, each of the conductive terminals is provided with a base portion accommodated in a corresponding one of the accommodating slots, the conductive portion is formed by extending downward from the base portion, the first conductive portion is located above the second conductive portion, each of the conductive terminals further comprises a strip connecting portion provided on at least one side of the base portion, and the strip connecting portion extends horizontally outward to an upper location of the upper surface of the adapter board outside the corresponding one of the accommodating slots.

7. The connector assembly according to claim 1, wherein an upper surface of the adapter board is provided with at least one first high speed conductive sheet and at least one second high speed conductive sheet, the first conductive portion is electrically connected to the first high speed conductive sheet by surface mounting, the second conductive portion is electrically connected to the second high speed conductive sheet by surface mounting, the adapter board further comprises at least one first high speed connecting circuit and at least one second high speed connecting circuit, each of the at least one first high speed connecting circuit extends in the vertical direction and connects one of the at least one first high speed conductive sheet and one of the at least one first high speed signal circuit, and each of the at least one second high speed connecting circuit extends in the vertical direction and connects one of the at least one second high speed conductive sheet and one of the at least one second high speed signal circuit.

8. The connector assembly according to claim 1, further comprising an insulating body located above the adapter board, wherein each of the conductive terminals comprises a base portion, a contact arm formed by extending from one end of the base portion and the conductive portion formed by extending from another end of the base portion, the base portion is at least partially embedded in the insulating body, the contact arm is provided with the contact portion, and the conductive terminals are fixed to the insulating body by insert-molding.

9. The connector assembly according to claim 8, wherein the conductive portion and the corresponding base portion are located on a same horizontal plane, and the base portion is limited between an upper surface and a lower surface of the insulating body.

10. The connector assembly according to claim 8, wherein a portion of the conductive portion of each of the conductive terminals exposed in the insulating body is provided with at least one through hole running vertically therethrough, a solder enters the through hole and covers an upper surface of the conductive portion, and the conductive portion is fixed to the adapter board by the solder.

11. The connector assembly according to claim 8, further comprising a metal sheet embedded in the insulating body, wherein the conductive terminals further comprise a plurality of ground terminals connected to the metal sheet, and the metal sheet is provided to be spaced apart from the first high speed signal terminal, the second high speed signal terminal and the low speed signal terminal.

12. The connector assembly according to claim 11, wherein the metal sheet is a metal plate which is only connected to the ground terminals after forming the conductive terminals.

13. The connector assembly according to claim 11, wherein the insulating body is provided with a plurality of accommodating holes, each of the accommodating holes exposes the contact arm of a corresponding one of the conductive terminals, the metal sheet is provided with a plurality of strip connecting bridges connecting the ground terminals, and each of the strip connecting bridges is provided on a connecting location of the base portion and the contact arm and is exposed in a corresponding one of the accommodating holes.

14. The connector assembly according to claim 8, wherein the adapter board further comprises at least one low speed signal circuit and at least one grounding circuit, the low speed signal circuit and the grounding circuit respectively extend along the vertical direction in the adapter board, an upper surface of the adapter board is provided with a low speed signal conductive sheet corresponding to a top end of each of the at least one low speed signal circuit, the upper surface of the adapter board is further provided with a grounding conductive sheet corresponding to a top end of each of the at least one grounding circuit, the conductive terminals comprise at least one ground terminal, the conductive portion of the ground terminal is defined as a fourth conductive portion, the low speed signal conductive sheet is electrically connected to the third conductive portion and the low speed signal circuit, and the grounding conductive sheet is electrically connected to the fourth conductive portion and the grounding circuit.

15. The connector assembly according to claim 8, wherein each of the accommodating holes comprises a first hole, a second hole and a third hole, the first hole runs vertically through the insulating body and is configured to accommodate the contact arm, the second hole is formed by being downward concavely provided on an upper surface of the insulating body, the third hole is formed by being upward concavely provided on a lower surface of the insulating body, the second hole is in communication with the first hole and is in downward communication with the third hole, the first hole and the third hole are provided to be horizontally spaced apart, the base portion and the conductive portion are both accommodated in the second hole, the conductive portion is downward exposed in the third hole, and the third hole is configured to accommodate a solder.

16. The connector assembly according to claim 1, wherein a lower surface of the adapter board comprises a plurality of pads having a quantity identical to a quantity of the conductive terminals, the pads comprise at least one first pad and a plurality of second pads, each of the at least one first pad is electrically connected to one of the at least one low speed signal terminal, each of the second pads is not electrically connected to the high speed signal terminals and the at least one low speed signal terminal, the circuit board is provided with a plurality of solder pads having a quantity identical to the quantity of the pads and one-to-one corresponding to the pads, and each of the pads and a corresponding one of the solder pads are soldered and fixed by a solder.

17. The connector assembly according to claim 1, wherein the adapter board comprises a plurality of conductive sheets, the conductive portion of each of the conductive terminals is electrically connected to one of the conductive sheets, one of the conductive terminals comprises a first terminal and a second terminal formed individually, the first terminal is provided with a first leg and a first contact arm formed by extending upward from the first leg, the contact portion is formed on the first contact arm, the second terminal comprises a second leg and a second contact arm formed by extending upward from the second leg, the second contact arm upward abuts the first contact arm, and the first leg and the second leg altogether form the conductive portion.

18. The connector assembly according to claim 17, wherein the first leg and the second leg are attached to each other, the first contact arm and the second contact arm are attached to each other, and the second contact arm extends along the first contact arm and ends before reaching the contact portion.

19. The connector assembly according to claim 17, wherein the first leg and the second leg are provided to be horizontally side-by-side, the second contact arm has a first arm located at one side of the first contact arm and a second arm bending and extending from the first arm and extending to be below the first contact arm, and the second arm upward abuts the first contact arm.

20. The connector assembly according to claim 1, wherein one of the conductive terminals comprises a first terminal and a second terminal formed individually, the first terminal is provided with a first leg and a first contact arm formed by extending upward from the first leg, the contact portion is formed on the first contact arm, the second terminal comprises a second leg and a second contact arm formed by extending upward from the second leg, the second contact arm upward abuts the first contact arm, the adapter board is provided with two conductive sheets respectively corresponding to and conductively connected to the first leg and the second leg, the conductive sheet being conductively connected to the first leg and the conductive sheet being conductively connected to the second leg are provided to be spaced apart on the adapter board and are electrically connected to each other.

* * * * *